(12) United States Patent
Kim et al.

(10) Patent No.: US 8,309,460 B2
(45) Date of Patent: Nov. 13, 2012

(54) METHODS OF MANUFACTURING SEMICONDUCTOR DEVICES

(75) Inventors: Dae-Ik Kim, Yongin-si (KR); Ho-Jun Yi, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 233 days.

(21) Appl. No.: 12/662,993

(22) Filed: May 14, 2010

(65) Prior Publication Data

US 2011/0065275 A1    Mar. 17, 2011

(30) Foreign Application Priority Data

Sep. 14, 2009 (KR) .................. 10-2009-0086631

(51) Int. Cl.
*H01L 21/44* (2006.01)

(52) U.S. Cl. ......... 438/666; 257/E21.023; 257/E21.035; 257/E21.058; 257/E21.246; 257/E21.257; 257/E21.488; 438/551; 438/667; 438/668; 438/671; 438/717; 438/736

(58) Field of Classification Search ........... 257/E21.023, 257/E21.035, E21.058, E21.246, E21.257, 257/E21.488; 438/551, 666, 667, 668, 671, 438/717, 736
See application file for complete search history.

(56) References Cited

U.S. PATENT DOCUMENTS

| 7,521,348 | B2 | 4/2009 | Kwon et al. | |
|---|---|---|---|---|
| 2009/0053892 | A1 | 2/2009 | Meyer et al. | |
| 2009/0323385 | A1* | 12/2009 | Scheuerlein et al. | ........... 365/51 |

FOREIGN PATENT DOCUMENTS

| JP | 2008-118130 A | 5/2008 |
|---|---|---|
| JP | 2009049420 A | 3/2009 |
| KR | 10-0843713 | 7/2008 |
| KR | 20080074529 A | 8/2008 |

* cited by examiner

*Primary Examiner* — Asok Sarkar
(74) *Attorney, Agent, or Firm* — Harness, Dickey & Pierce, P.L.C.

(57) ABSTRACT

Provided are methods of manufacturing semiconductor devices by which two different kinds of contact holes with different sizes are formed using one photolithography process. The methods include preparing a semiconductor substrate in which an active region is titled in a diagonal direction. A hard mask is formed on the entire surface of the semiconductor substrate. A mask hole is patterned not to overlap a word line. A first oxide layer is deposited on the hard mask, and the hard mask is removed to form a piston-shaped sacrificial pattern. A first polysilicon (poly-Si) layer is deposited on the sacrificial pattern and patterned to form a cylindrical first sacrificial mask surrounding the piston-shaped sacrificial pattern. A second oxide layer is coated on the first sacrificial mask to such an extent as to form voids. A second poly-Si layer is deposited in the voids and patterned to form a pillar-shaped second sacrificial mask. The second oxide layer is removed to expose the active region. The sectional area of a buried contact (BC) storage contact pad may be increased, while the sectional area of a direct contact (DC) bit line contact pad may be reduced.

20 Claims, 27 Drawing Sheets

120 130

METHODS OF MANUFACTURING SEMICONDUCTOR DEVICES

CROSS-REFERENCE TO RELATED APPLICATION

This application claims priority to Korean Patent Application No. 10-2009-0086631, filed Sep. 14, 2009, in the Korean Intellectual Property Office (KIPO), the entire contents of which is incorporated herein by reference.

BACKGROUND

1. Field

Example embodiments of the inventive concepts relate to methods of manufacturing semiconductor devices, and more particularly, to methods of manufacturing semiconductor devices including contact holes of different sizes formed using a single photolithography process.

2. Description of Related Art

In recent years, demand for high-capacity semiconductor memory devices, especially high-capacity dynamic random access memories (DRAMs), has been ever increasing. However, there is a specific technical limit to increasing the capacity of DRAM devices due to increasing chip size. An increase in chip size may lead to a reduction in the number of chips per wafer, thereby reducing productivity. Thus, many attempts are being made at varying a cell layout to reduce a cell area so that the greatest possible number of memory cells may be integrated on a single wafer. As a result, a conventional 8F2 layout may be gradually superseded by a 6F2 layout.

However, since a semiconductor memory device having a 6F2 DRAM cell has an interval of only 1F between active regions, a contact area between a BC contact and a BC storage contact pad may become vulnerable when misaligned. Furthermore, the BC contact may be brought into contact with its adjacent DC bit line contact pad, thereby causing a short.

SUMMARY

Example embodiments of the inventive concepts may provide methods of manufacturing semiconductor devices that include selectively increasing or reducing a contact area by increasing or reducing sectional areas of a buried contact (BC) storage contact pad and/or a direct contact (DC) bit line contact pad. Example embodiments of the inventive concepts may provide methods of manufacturing semiconductor devices that include forming a BC storage contact pad with a greater sectional area than a DC bit line contact pad. Example embodiments of the inventive concepts may provide methods of manufacturing a semiconductor device including forming two different kinds of contact holes with different sizes using a single photolithography process.

According to example embodiments of the inventive concepts, a method of manufacturing a semiconductor device includes forming a first material layer on a substrate in which an active region defined by an isolation region intersects two word lines. A hard mask having a plurality of mask holes is formed on the first material layer using photolithography and etching processes. A first oxide layer is formed in the mask holes and the hard mask is removed to form a piston-shaped sacrificial pattern. A second material layer having an etch selectivity with respect to the first oxide layer is formed on the sacrificial pattern and the second material layer is etched to form a cylindrical first sacrificial mask. A second oxide layer is uniformly formed on the first sacrificial mask such that voids are formed in the second oxide layer. A third material layer having an etch selectivity with respect to the second oxide layer is formed in the voids and the third material layer is etched back to form a pillar-shaped second sacrificial mask. The first and second oxide layers are moved until the active region is exposed, a BC contact hole is formed between the first sacrificial mask and the second sacrificial mask, and a DC contact hole is formed within the cylindrical first sacrificial mask. A BC storage contact pad to be connected to a storage electrode is formed in the BC contact hole and A DC bit line contact pad to be connected to a bit line is in the DC contact hole.

According to example embodiments of the inventive concepts, a method of manufacturing a semiconductor device includes forming a first material layer, forming a hard mask including a plurality of mask holes on the first material layer, forming a first sacrificial layer in the mask holes, removing the hard mask to form a plurality of sacrificial patterns including the first sacrificial layer, forming a second material layer on the sacrificial patterns, removing part of the second material layer to form a plurality of first sacrificial masks, each of the sacrificial patterns at least partially surrounded by a corresponding one of the first sacrificial masks, forming a second sacrificial layer on the first sacrificial masks, the second sacrificial layer formed to include voids, forming a third material layer in the voids, removing part of the third material layer to form a plurality of second sacrificial masks, removing at least part of the sacrificial patterns, the second sacrificial layer, and the first material layer such that a plurality of first contact holes are formed between the first sacrificial masks and the second sacrificial masks, and a plurality of second contact holes are formed within the first sacrificial masks.

The semiconductor device may have a 6F2 layout in which the active region is tilted in a diagonal direction to the word line and the bit line. The mask holes may be arranged at regular intervals in a region which does not overlap the word line and the bit line but does overlap the active region, and formed in a circular shape with a diameter smaller than a distance between word lines. The first material layer may be Si—SOH layer, and the second and third material layer may be a polysilicon (poly-Si) layer or nitride layer having an etch selectivity with respect to an oxide layer. The voids may be formed at regular intervals between adjacent first sacrificial masks during the formation of the second oxide layer on the first sacrificial mask.

The relative sectional areas of the BC storage contact pad and the DC bit line contact pad may be varied according to the sectional areas of the sacrificial pattern, the first sacrificial mask, and the second sacrificial mask. The BC storage contact pad may have a greater sectional area than the DC bit line contact pad. During the formation of the piston-shaped sacrificial pattern, a cross-sectional radius of the piston-shaped sacrificial pattern may be reduced to reduce the sectional area of the DC contact hole. During the formation of the cylindrical first sacrificial mask, a cross-sectional thickness of the cylindrical first sacrificial mask may be reduced to increase the sectional area of the BC contact hole. During the formation of the pillar-shaped second sacrificial mask, a cross-sectional length of the pillar-shaped second sacrificial mask may be reduced to increase the sectional area of the BC contact hole.

The method may further include depositing a second interlayer insulating layer on the BC storage contact pad and the DC bit line contact pad. A DC exposure hole exposing the DC bit line contact pad may be formed in the second interlayer insulating layer and filled with a conductive material to form a DC contact. A bit line interconnection and a capping insulating layer may be formed on the DC contact, and a third interlayer insulating layer may be deposited on the capping insulating layer. The third interlayer insulating layer may be partially recessed, and spacers may be formed on both sides of the capping insulating layer or the bit line interconnection. A BC exposure hole exposing the BC storage contact pad may be formed using the spacers as an etch mask. The BC exposure hole may be filled with a conductive material to form a BC contact. A storage electrode may be formed on the BC contact.

According example embodiments of the inventive concepts, a method of manufacturing a semiconductor device including first contact holes and second contact holes having different sizes may be provided. The method includes forming a piston-shaped sacrificial pattern formed of an oxide layer on a semiconductor substrate. The piston-shaped sacrificial pattern is formed to a radius corresponding to the first contact hole. A cylindrical first sacrificial mask is formed of a first poly-Si layer around the sacrificial pattern. The cylindrical first sacrificial mask is formed to a thickness corresponding to a distance between the cylindrical first sacrificial mask and the first and second contact holes. A pillar-shaped second sacrificial mask formed of a second poly-Si layer is formed between the first sacrificial masks. The pillar-shaped second sacrificial mask is formed to a length corresponding to a distance between a pair of adjacent second contact holes.

According example embodiments of the inventive concepts, a method of manufacturing a semiconductor device including a plurality of first contact holes and a plurality of second contact holes, the first contact holes having a different size than the second contact holes, including forming a piston-shaped sacrificial pattern on a substrate, the piston-shaped sacrificial pattern formed to a radius corresponding to one of the first contact holes, forming a cylindrical first sacrificial mask around the piston-shaped sacrificial pattern, a width of the cylindrical first sacrificial mask corresponding to a distance between the first and second contact holes, and forming a pillar-shaped second sacrificial mask on the substrate, a width of the pillar-shaped second sacrificial mask corresponding to a distance between adjacent second contact holes.

The formation of the piston-shaped pattern may include performing photolithography and etching processes once each. The photolithography and etching processes may include: stacking a hard mask material layer on the semiconductor substrate; coating photoresist on the hard mask material layer and exposing and developing the photoresist; forming a hard mask including a mask hole corresponding to the first contact hole; depositing an oxide layer in the mask hole; and removing the hard mask. The formation of the first sacrificial mask may include depositing the first poly-Si layer on the sacrificial pattern and etching the first poly-Si layer into a cylindrical shape. The formation of the second sacrificial mask may include: depositing an oxide layer on the first sacrificial mask again to form voids; and depositing the second poly-Si layer in the voids and etching the second poly-Si layer into a pillar shape.

According to example embodiments of the inventive concepts, a method of manufacturing a semiconductor device includes preparing a semiconductor substrate in which a gate electrode is formed in a diagonal direction to an active region and an interlayer insulating layer is formed between the gate electrodes. A hard mask including mask holes is formed on the entire surface of the semiconductor substrate to expose the interlayer insulating layer. A first oxide layer is formed on the hard mask, and the hard mask is removed to form piston-shaped sacrificial patterns corresponding to the mask holes. A first poly-Si layer is deposited on the sacrificial patterns and etched to form a cylindrical first sacrificial mask around the piston-shaped sacrificial pattern. A second oxide layer is formed on the first sacrificial mask to form voids between the first sacrificial masks, and a second poly-Si layer is formed in the voids and the second poly-Si layer is etched back to form a pillar-shaped second sacrificial mask corresponding to the voids. The second oxide layer and the piston-shaped sacrificial patterns are removed until the active region is exposed, thereby patterning two different kinds of contact holes with different sizes. The mask holes may overlap the active region, and the voids may not overlap the active region.

According example embodiments of the inventive concepts, a method of manufacturing a semiconductor device including first contact holes and second contact holes having different sizes may be provided. The method includes forming an active region in a semiconductor substrate, forming a plurality of gate electrodes on the substrate, the gate electrodes formed diagonally to the active region, forming an interlayer insulating layer between the gate electrodes, forming a hard mask including a plurality of mask holes on the interlayer insulating layer, the mask holes exposing the interlayer insulating layer, forming a first oxide layer in the mask holes, removing the hard mask to form a plurality of piston-shaped sacrificial patterns corresponding to the first oxide layer in the mask holes, depositing a first poly-Si layer on the piston-shaped sacrificial patterns, etching the first poly-Si layer to form a plurality of cylindrical first sacrificial masks, each of the cylindrical first sacrificial masks surrounding one of the piston-shaped sacrificial patterns, forming a second oxide layer on the cylindrical first sacrificial masks such that voids are formed between the cylindrical first sacrificial masks, depositing a second poly-Si layer in the voids, etching back the second poly-Si layer to form a plurality of pillar-shaped second sacrificial masks corresponding to the voids; and removing the second oxide layer and the piston-shaped sacrificial patterns to expose the active region such that two different types of contact holes of different sizes are formed.

According to example embodiments of the inventive concepts, a method of manufacturing a semiconductor device includes forming a bar-shaped active region in a semiconductor substrate using an isolation process. A straight word line is formed using a gate process. An interlayer insulating layer is formed between the word lines using a gap filling process. A silicon hard mask material (Si—SOH) layer is formed on the entire surface of the semiconductor substrate. Photolithography and etching processes are performed on the material layer to form a hard mask having a plurality of mask holes. A silicon oxide layer is formed on the hard mask having the mask holes, and the hard mask is removed to form a piston-shaped sacrificial pattern. A first poly-Si layer or a first nitride layer is formed on the sacrificial pattern and patterned to form a cylindrical first sacrificial mask surrounding the piston-shaped sacrificial pattern. A first oxide layer is uniformly deposited on the first sacrificial mask, and voids are formed using voids in which the first oxide layer is not deposited. A second poly-Si layer or a second nitride layer is deposited in the voids and the second poly-Si layer or a second nitride layer is etched back to form a pillar-shaped second sacrificial mask between the first sacrificial masks. The first and second oxide layers are removed until the active region is exposed, a first contact hole is formed between the first and second sacrificial masks, and a second contact hole is formed within the cylindrical first sacrificial mask. A BC storage contact pad to be connected to a storage electrode is formed in the first contact hole. A DC bit line contact pad to be connected to the bit line is formed in the second contact hole.

According to example embodiments of the inventive concepts, a method of manufacturing a semiconductor device includes forming a plurality of bar-shaped active regions in a semiconductor substrate using an isolation process forming a plurality of straight word lines using a gate process, forming an interlayer insulating layer between the word lines using a gap fill process, forming a silicon hard mask material layer on the entire surface of the semiconductor substrate, forming a hard mask having a plurality of mask holes, the hard mask formed by using photolithography and etching processes on the hard mask material layer, forming a first oxide layer in the mask holes, removing the hard mask to form a plurality of piston-shaped sacrificial patterns, forming one of a first poly-Si layer and a first nitride layer on the sacrificial patterns, patterning the one of the first poly-Si layer and the first nitride layer to form a plurality of cylindrical first sacrificial masks surrounding the piston-shaped sacrificial patterns, conformally forming a second oxide layer on the cylindrical first sacrificial masks, the second oxide layer formed to include voids, forming one of a second poly-Si layer and a second nitride layer in the voids, etching back the one of the second poly-Si layer and the second nitride layer to form a plurality of pillar-shaped second sacrificial masks between the cylindrical first sacrificial masks, removing the piston-shaped sacrificial patterns and second oxide layer to expose the active region such that a first contact hole is formed between each of the cylindrical first sacrificial masks and the pillar-shaped second sacrificial masks, and a second contact hole is formed within each of the cylindrical first sacrificial masks, forming BC storage contact pads in the first contact holes; and forming DC bit line contact pads in the second contact holes.

The BC storage contact pad may have the same sectional area as the DC bit line contact pad. The BC storage contact pad may have a greater sectional area than the DC bit line contact pad.

BRIEF DESCRIPTION OF THE DRAWINGS

Example embodiments of the inventive concepts will be more clearly understood from the following brief description taken in conjunction with the accompanying drawings.

FIG. 1 is a plan view of part of a semiconductor device illustrating an arrangement of BC storage contact pads and DC bit line contact pads;

FIGS. 2 and 3 are cross-sectional views taken along line I-I' of FIG. 1 according to example embodiments of the inventive concepts;

FIG. 4 is a plan view of part of a semiconductor device illustrating methods of manufacturing a semiconductor device according to example embodiments of the inventive concepts;

FIG. 5 is a cross-sectional view taken along line V-V' of FIG. 4;

FIG. 6 is a plan view of part of a semiconductor device illustrating methods of manufacturing a semiconductor device according to example embodiments of the inventive concepts;

FIG. 7 is a cross-sectional view taken along line VII-VII' of FIG. 6;

FIG. 8 is a plan view of part of a semiconductor device illustrating methods of manufacturing a semiconductor device according to example embodiments of the inventive concepts;

FIG. 9 is a cross-sectional view taken along line IX-IX' of FIG. 8;

FIG. 10 is a plan view of part of a semiconductor device illustrating methods of manufacturing a semiconductor device according to example embodiments of the inventive concepts;

FIG. 11 is a cross-sectional view taken along line XI-XI' of FIG. 10;

FIG. 12 is a plan view of part of a semiconductor device illustrating methods of manufacturing a semiconductor device according to example embodiments of the inventive concepts;

FIG. 13 is a cross-sectional view taken along line XIII-XIII' of FIG. 12;

FIG. 14 is a plan view of part of a semiconductor device illustrating methods of manufacturing a semiconductor device according to example embodiments of the inventive concepts;

FIG. 15 is a cross-sectional view taken along line XV-XV' of FIG. 14;

FIG. 16 is a plan view of part of a semiconductor device illustrating methods of manufacturing a semiconductor device according to example embodiments of the inventive concepts;

FIG. 17 is a cross-sectional view taken along line XVII-XVII' of FIG. 16;

FIG. 18 is a plan view of part of a semiconductor device illustrating methods of manufacturing a semiconductor device according to example embodiments of the inventive concepts;

FIG. 19 is a cross-sectional view taken along line XIX-XIX' of FIG. 18;

FIG. 20 is a plan view of part of a semiconductor device illustrating methods of manufacturing a semiconductor device according to example embodiments of the inventive concepts;

FIG. 21 is a cross-sectional view taken along line XXI-XXI' of FIG. 20;

FIG. 22 is a plan view of part of a semiconductor device illustrating methods of manufacturing a semiconductor device according to example embodiments of the inventive concepts;

FIG. 23 is a cross-sectional view taken along line XXIII-XIII' of FIG. 22; and

FIGS. 24-27 are plan views illustrating sacrificial masks of various sizes.

Figure 1:
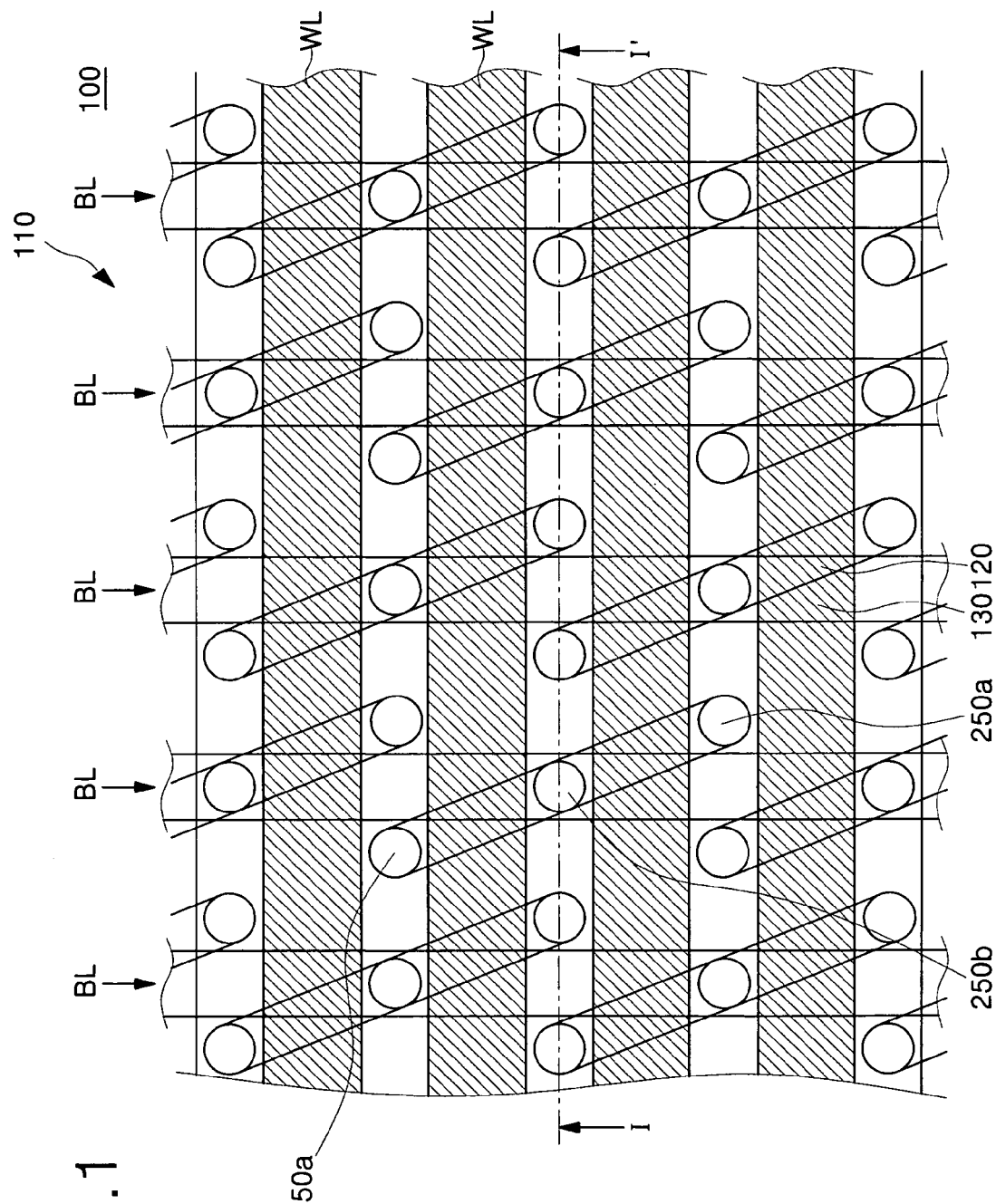
FIGS. 1-27 represent non-limiting, example embodiments as described herein.

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
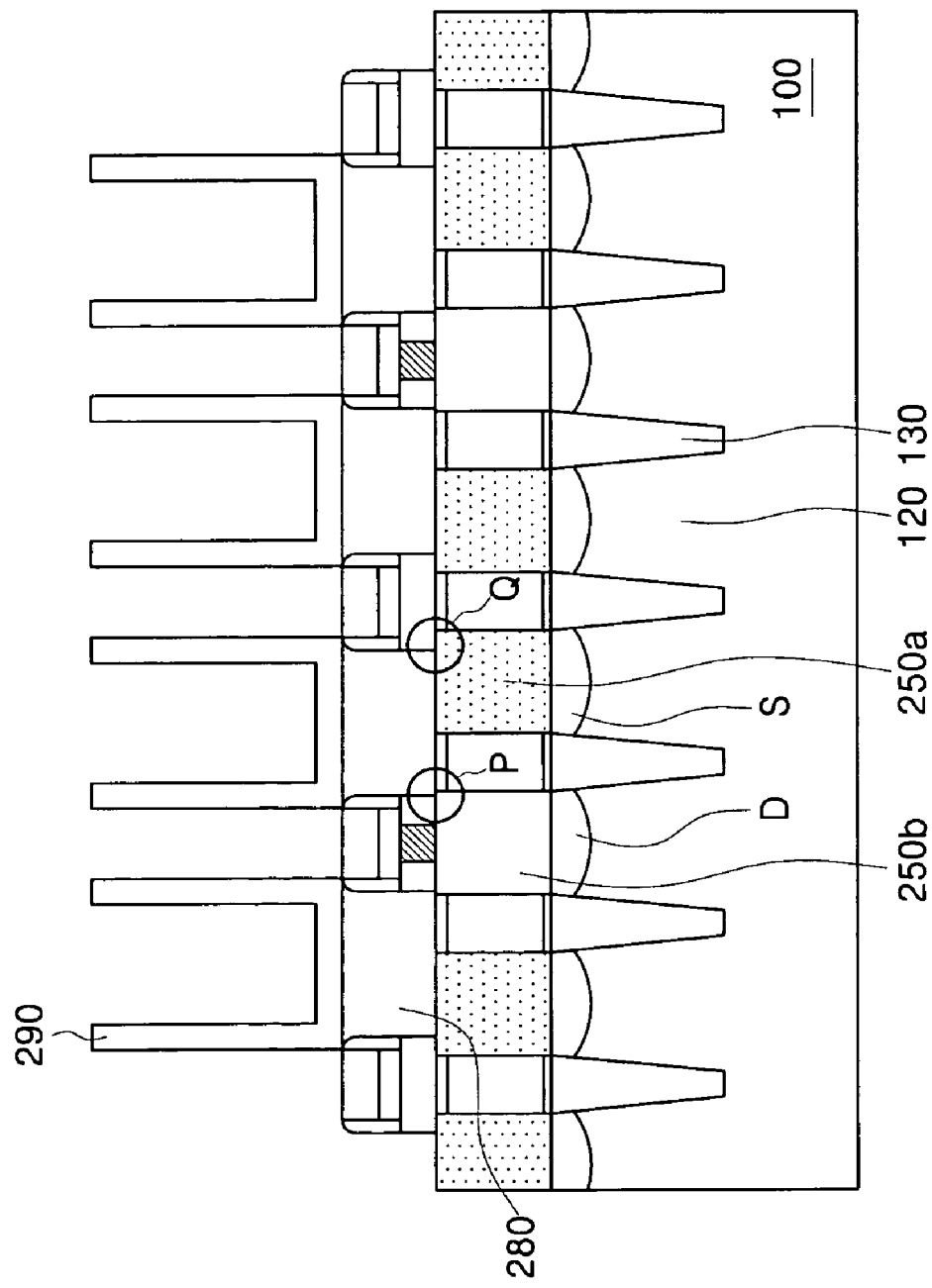
Figure 3:
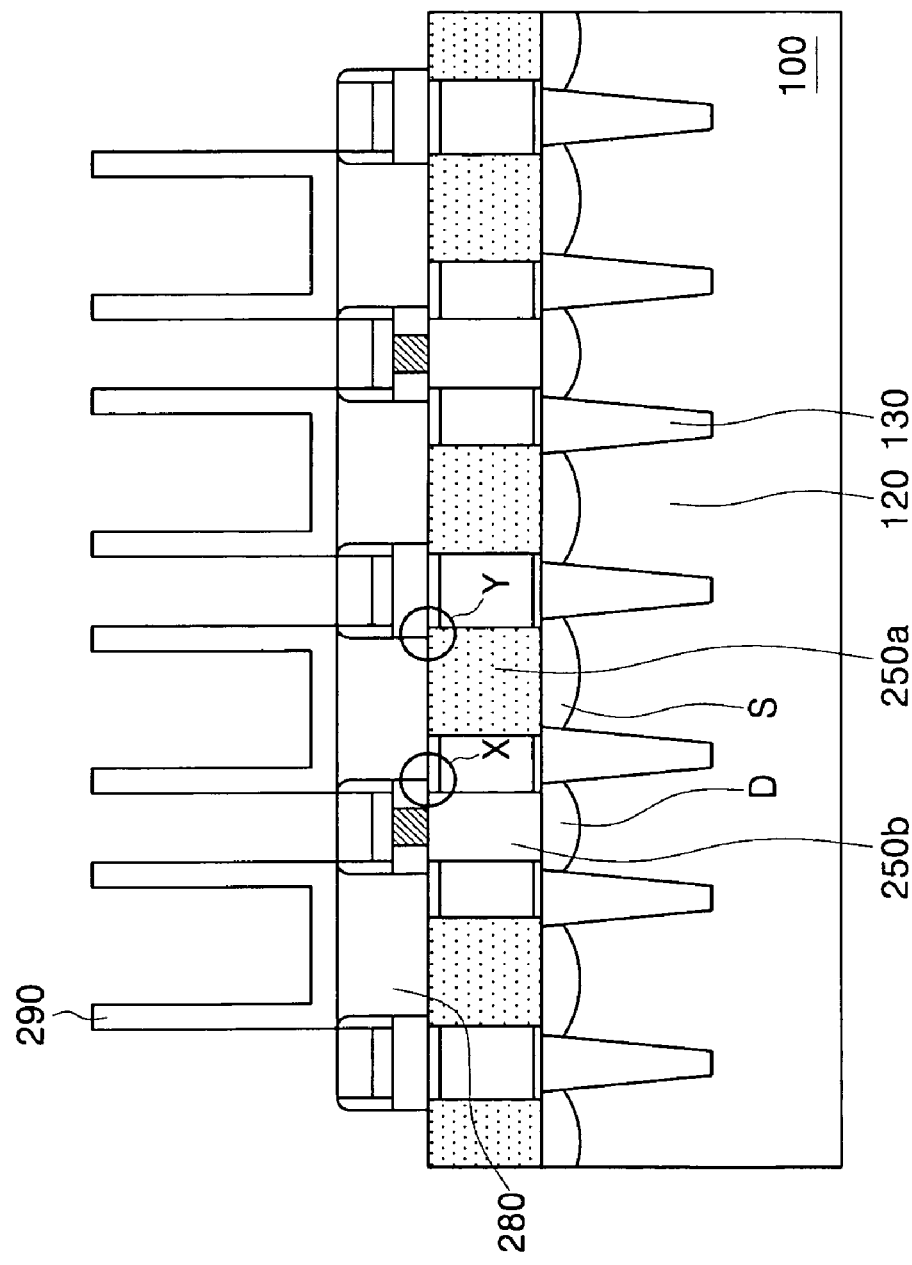

FIG. 1 is a plan view of part of a semiconductor device 110 illustrating an arrangement of BC storage contact pads and DC bit line contact pads. FIGS. 2 and 3 are cross-sectional views taken along line I-I' of FIG. 1 according to example embodiments of the inventive concepts. Referring to FIG. 1, active regions 120 defined by isolation regions 130 may be spaced apart from one another and may be repetitively arranged such that the active regions 120 are tilted in a diagonal direction. A word line WL including a gate electrode (not shown) may extend in an X direction. A bit line BL may extend in a Y direction.

The active region 120 may be tilted at an angle to the word line WL and the bit line BL such that each active region 120 intersects, for example, one bit line BL and two word lines WL. One active region 120 may have two unit cells, each unit cell having a Y-axial length of 6F, an X-axial length of 2F, and an area of 6F2, based on the minimum feature size (e.g., the minimum feature size F). In the 6F2 cell structure, the word lines WL may intersect the bit line BL at right angles to minimize and/or reduce a cell area. The active region 120 may be defined as a bar type active region by the isolation region 130, and may be tilted in a diagonal direction to the word line WL and the bit line BL.

Referring to FIGS. 1 and 2, in order to electrically connect a storage electrode 290 and a bit line BL to an active region 120, buried contact (BC) pads (hereinafter, BC storage contact pads 250a) may be between the storage electrode 290 and a source region S, and direct contact (DC) pads (hereinafter, DC bit line contact pads 250b) may be between the bit line BL and a drain region D. The BC storage contact pads 250a and the DC bit line contact pads 250b may have different sectional areas and may be arranged at intervals.

Referring to FIG. 2, the BC storage contact pads 250a and the DC bit line contact pads 250b may be self-aligned and may have the same sectional area. Referring to FIG. 3, the BC storage contact pad 250a may have a larger sectional area than the DC bit line contact pad 250b. A contact area between the BC storage contact pad 250a and a BC contact 280 may be increased.

Referring to FIG. 2, if the BC storage contact pads 250a and the DC bit line contact pads 250b are misaligned, because the BC storage contact pad 250a has the same sectional area as the DC bit line contact pad 250b as denoted by a region P of FIG. 2, an adjacent BC contact 280 may be brought into contact with the DC bit line contact pad 250b, thereby causing a short. As denoted by a region Q of FIG. 2, an overlap area between the BC storage contact pad 250a and the BC contact 280 may be reduced. A contact resistance may be increased.

Referring to FIG. 3, as denoted by a region X of FIG. 3, because the DC bit line contact pad 250b may have a small and/or reduced sectional area, a short between the DC bit line contact pad 250b and its adjacent BC contact 280 may be prevented and/or reduced even in a case of misalignment. As denoted by a region Y of FIG. 3, because the BC storage contact pad 250a may have a sufficient sectional area, an overlap contact area between the BC storage contact pad 250a and the BC contact 280 may be increased even in a case of misalignment. A contact resistance may be decreased.

By increasing or reducing the sectional area of the BC storage contact pad 250a and the sectional area of the DC bit line contact pad 250b, a sectional area between the BC storage contact pad 250a and the DC bit line contact pad 250b may be increased or reduced. If the BC contact 280 is misaligned with the BC storage contact pad 250a, a contact resistance may be prevented from increasing and/or reduced and/or increased less than compared to FIG. 2 due to an increased sectional area between the BC storage contact pad 250a and the DC bit line contact pad 250b.

Figure 4:
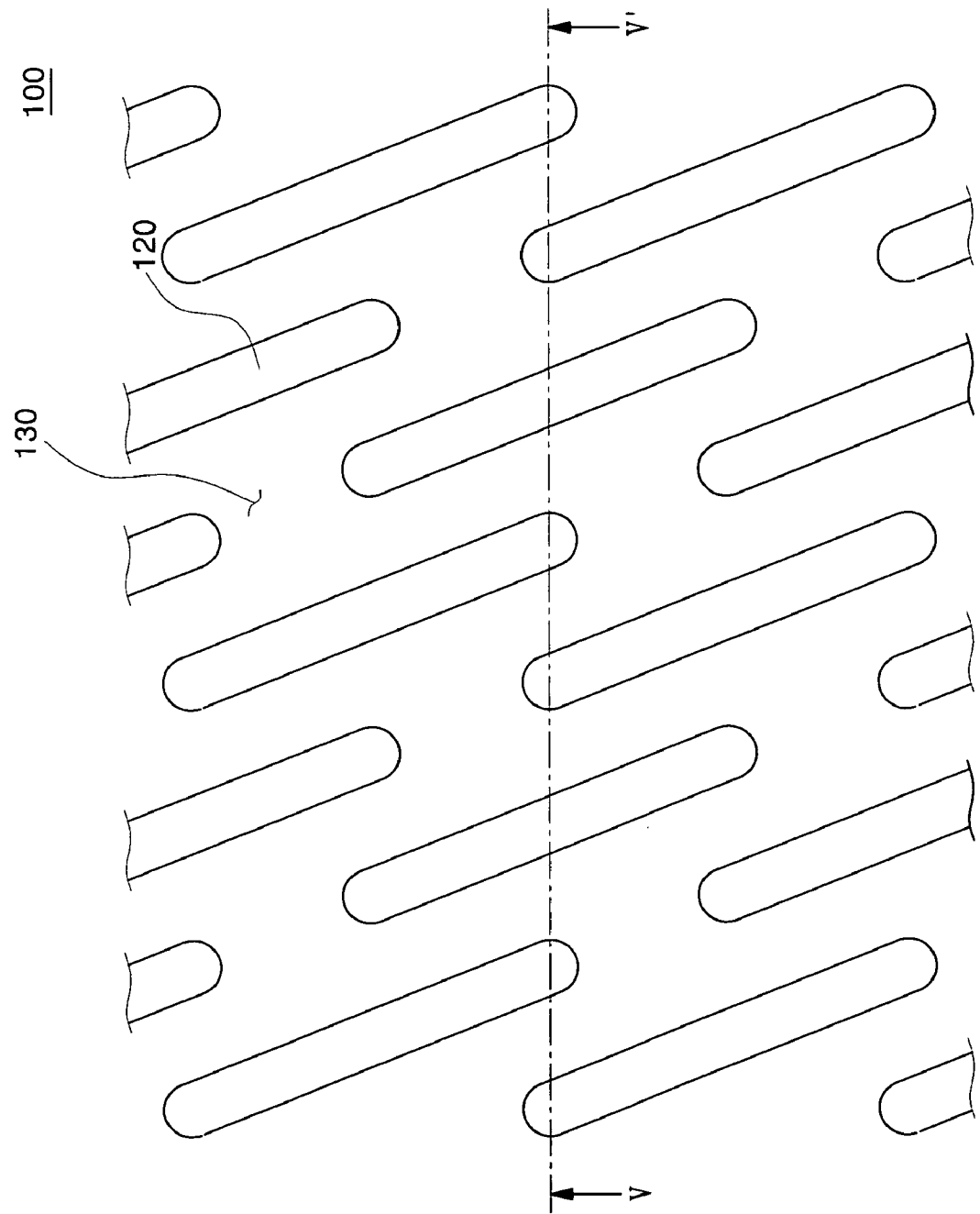
Figure 5:
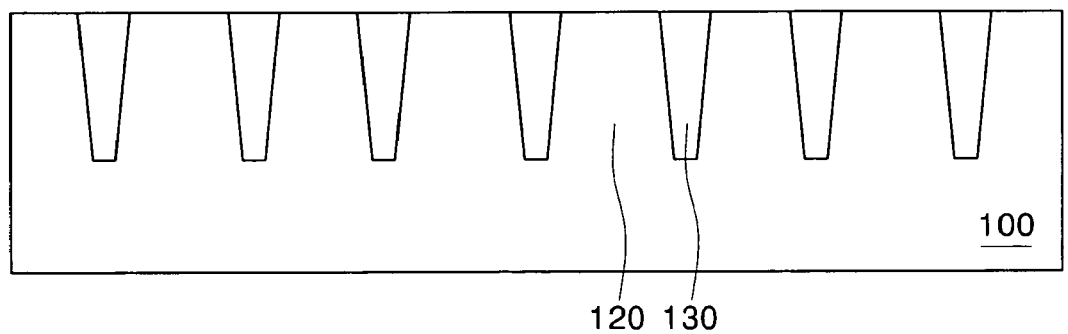

FIG. 4 is a plan view of part of a semiconductor device illustrating methods of manufacturing a semiconductor device according to example embodiments of the inventive concepts. FIG. 5 is a cross-sectional view taken along line V-V' of FIG. 4. Referring to FIGS. 1, 4 and 5, an isolation process may be performed. A trench (not shown) may be formed in a semiconductor substrate 100 and filled with an insulating material, forming an isolation region 130 defining an active region 120. For example, the isolation region 130 may be formed using shallow trench isolation (STI). As another example, the isolation region 130 may be formed by oxidizing only a selected region using an $O_2$ ion implantation process instead of forming a trench using, for example, an etch process.

Because the active region 120 may be tilted in a direction as shown in FIG. 4, the semiconductor device according to the present embodiments may substantially have a 6F2 cell structure. The 6F2 cell structure in which a lengthwise direction of the active region 120 may be tilted in a diagonal direction is illustrated as an example among various cell structures, for example, 8F2, 7F2, 6F2, and 4F2 cell structures. Example embodiments of the inventive concepts are not limited to a 6F2 cell structure. Any cell structure for improving the integration density of semiconductor devices may be adopted. The active region 120 may have a bar shape with a greater length than width and may be in a diagonal direction with respect to word lines WL and bit lines BL. Self-aligned contact (SAC) pads may be formed not as a line type but as a contact type (not shown).

A semiconductor device, for example, a transistor (not shown) may be formed. A gate process may be performed. A gate layer (not shown) and a gate capping layer (not shown) may be sequentially stacked on the semiconductor substrate 100. A gate capping layer pattern (not shown) and a gate layer pattern (not shown) may be formed by patterning the gate layer and the gate capping layer. The gate layer and the gate capping layer may be patterned using, for example, photolithography and etching processes. A source S and drain D may be formed using, for example, an ion implantation process. A gate electrode (not shown) of the transistor may function as a word line WL and may extend over the active region 120. The word line WL may be tilted at an angle to a lengthwise direction of the active region 120. Gaps may be disposed between a plurality of word lines WL and extend at an angle to the active regions 120.

Figure 6:
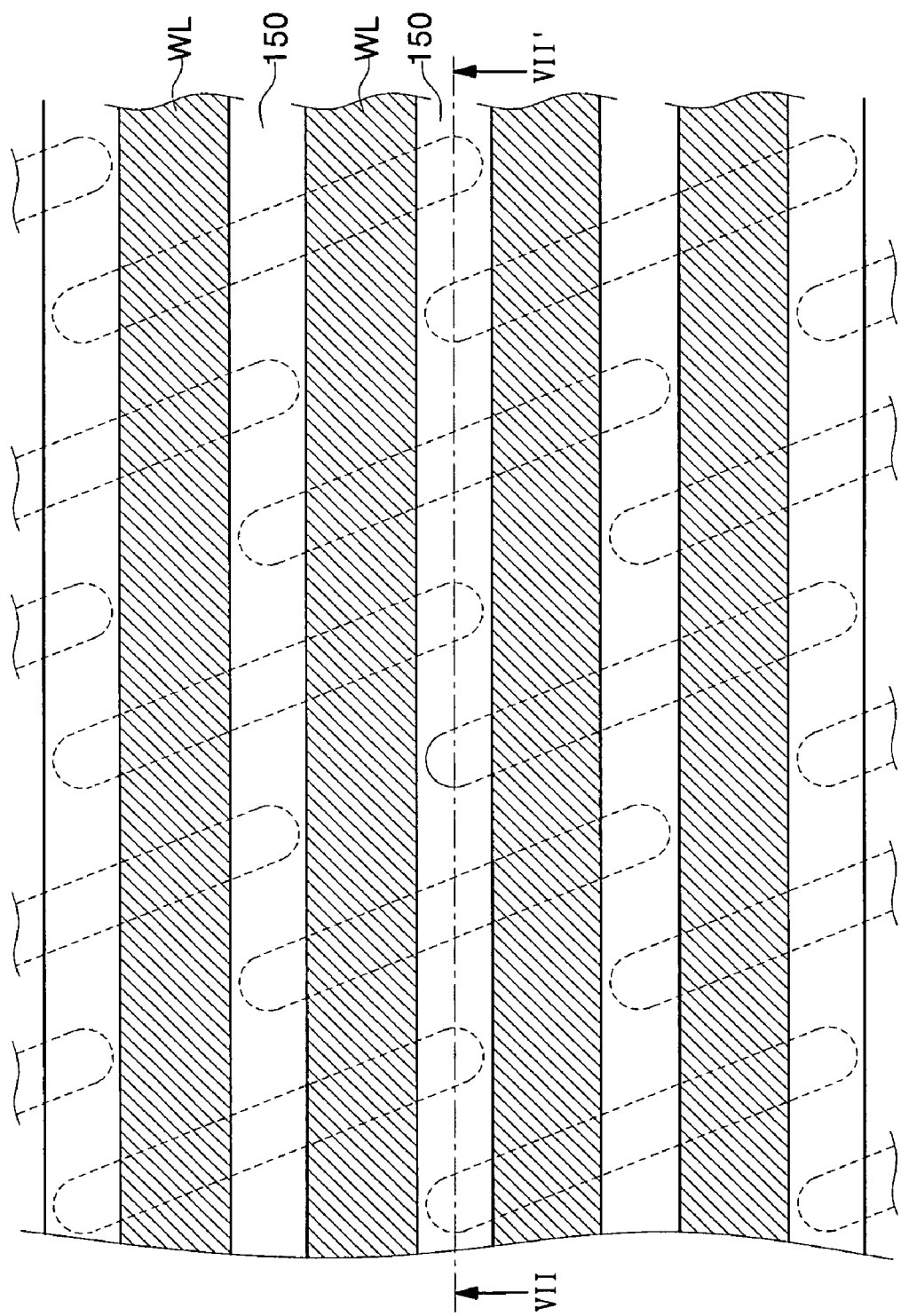
Figure 7:
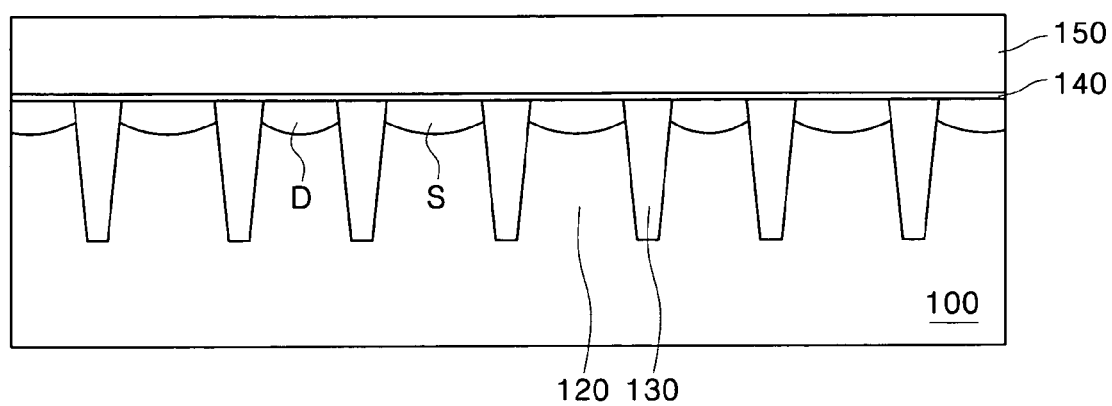

FIG. 6 is a plan view of part of a semiconductor device illustrating methods of manufacturing a semiconductor device according to example embodiments of the inventive concepts. FIG. 7 is a cross-sectional view taken along line VII-VII' of FIG. 6. Referring to FIGS. 6 and 7, a gap fill process may be performed to fill gaps between the plurality of word lines. By filling the gaps with an insulating material, a first interlayer insulating layer 150 may be formed. The first interlayer insulating layer 150 may be formed of, for example, a layer having good insulation and gap filling characteristics.

For example, the first interlayer insulating layer 150 may include a silicon oxide layer (e.g., high-density plasma (HDP) and/or boron phosphorous silicate glass (BPSG)). A stopper layer 140 may be formed between the first interlayer insulating layer 150 and the substrate. Contact pads (not shown) may be formed, for example, by performing a SAC process on the interlayer insulating layer 150. The contact pads may be formed, for example, in regions that do not overlap the word lines WL.

Figure 8:
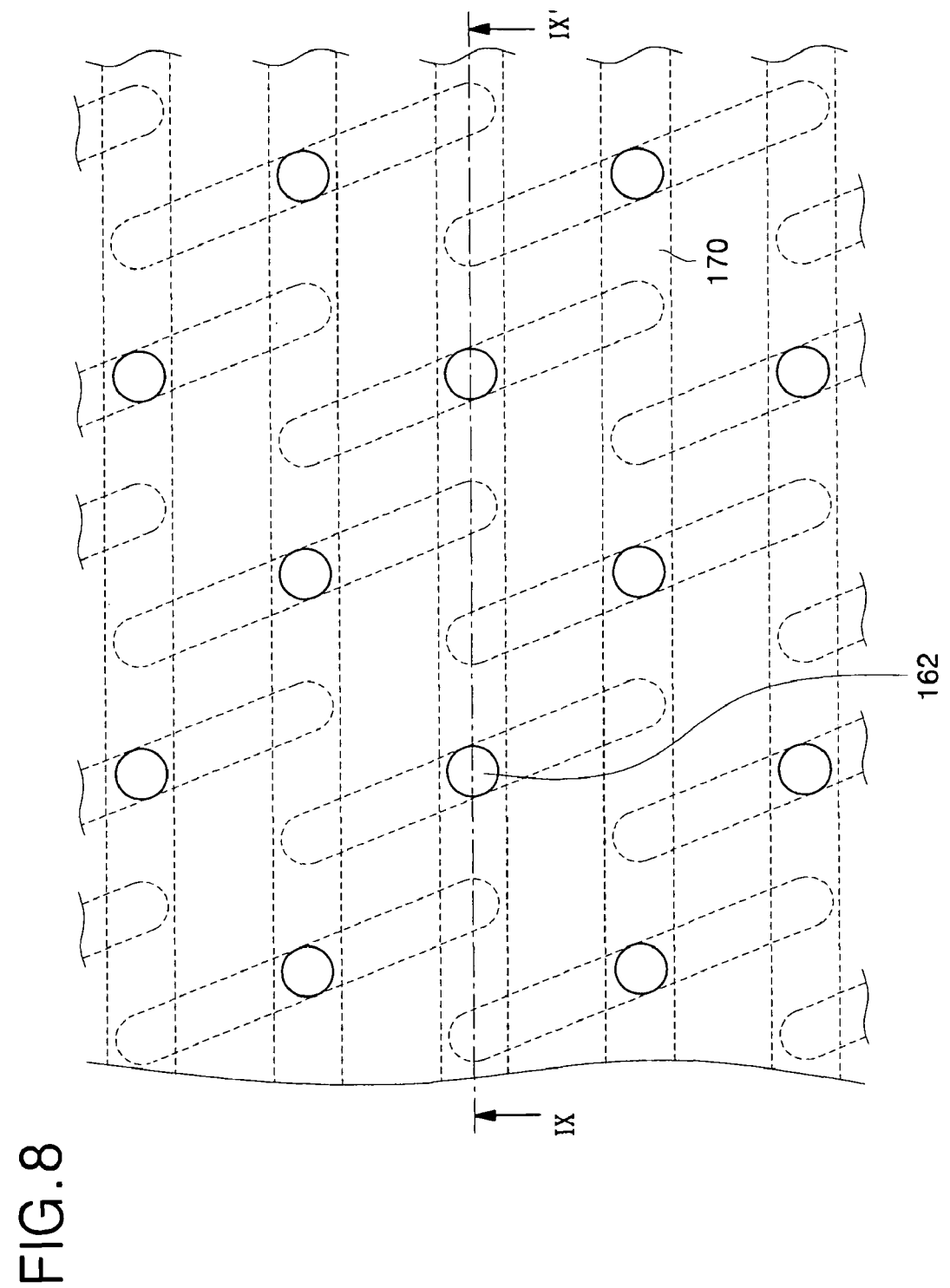
Figure 9:
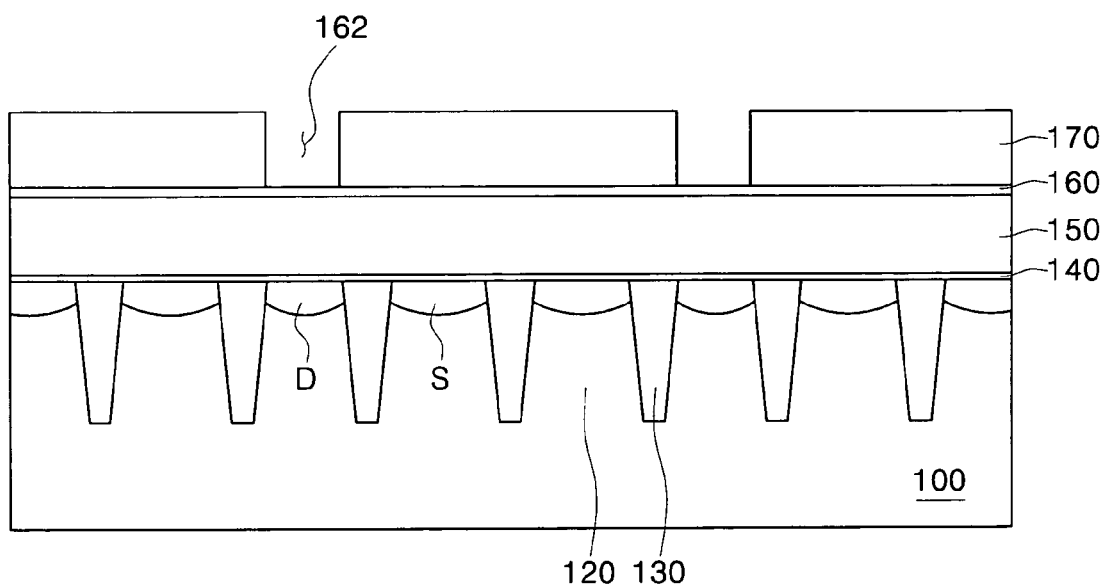

FIG. 8 is a plan view of part of a semiconductor device illustrating methods of manufacturing a semiconductor device according to example embodiments of the inventive concepts. FIG. 9 is a cross-sectional view taken along line IX-IX' of FIG. 8. Referring to FIGS. 8 and 9, a capping oxide layer 160 (e.g., a buffer layer) may be stacked on the first interlayer insulating layer 150. A silicon hard mask material (e.g., Si—SOH) layer (not shown) may be coated on the capping oxide layer 160.

The silicon hard mask material layer may be formed of, for example, a material having an etch selectivity with respect to an oxide layer. A hard mask 170 including a plurality of mask holes 162 may be formed by patterning the silicon hard mask material layer (e.g., using photolithography and etching processes). The mask holes 162 may be formed, for example, in regions which do not overlap the word lines WL and expose a top surface of the capping oxide layer 160. The mask holes 162 may be shaped, for example, as a circle type and/or rectangular type.

Figure 10:
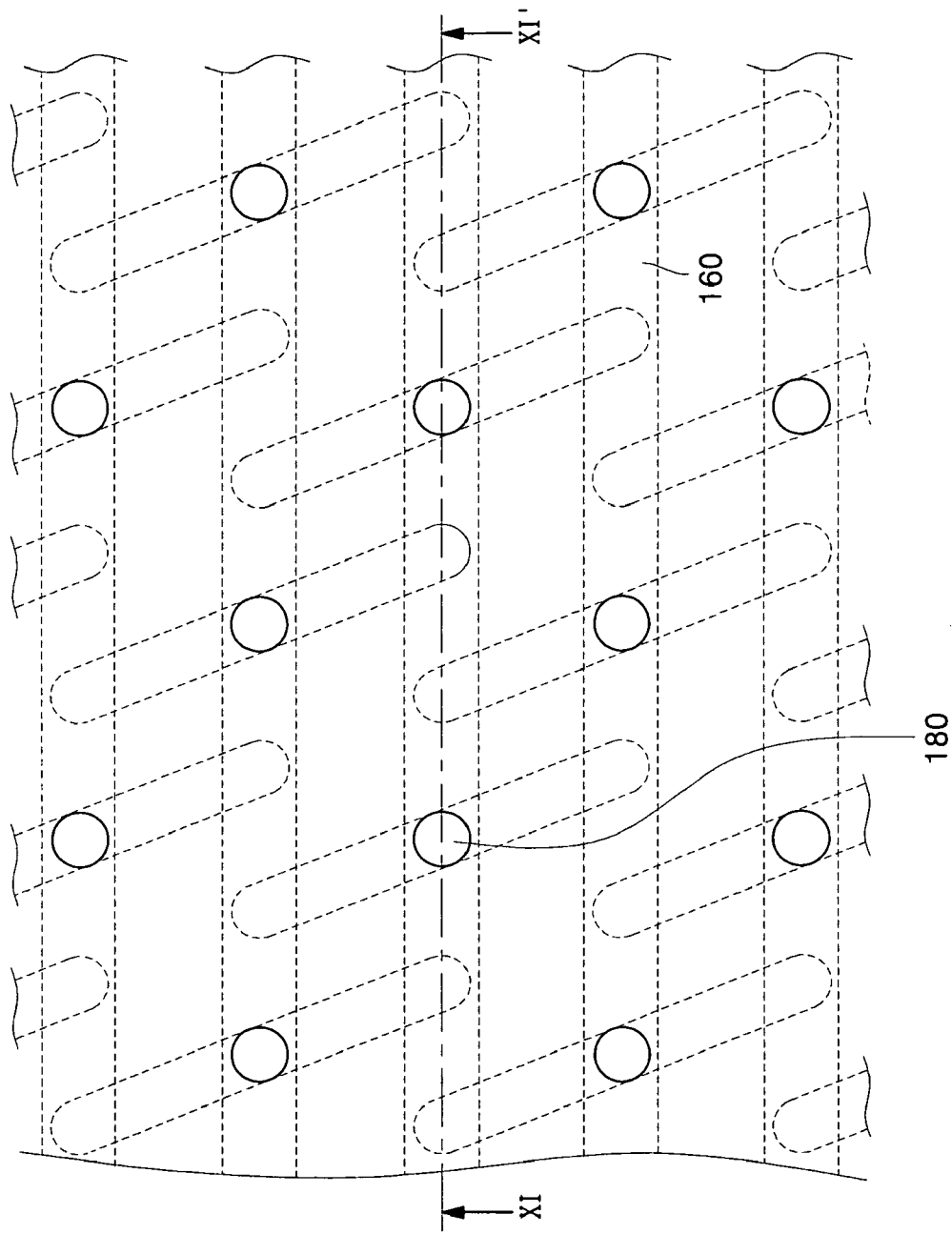
Figure 11:
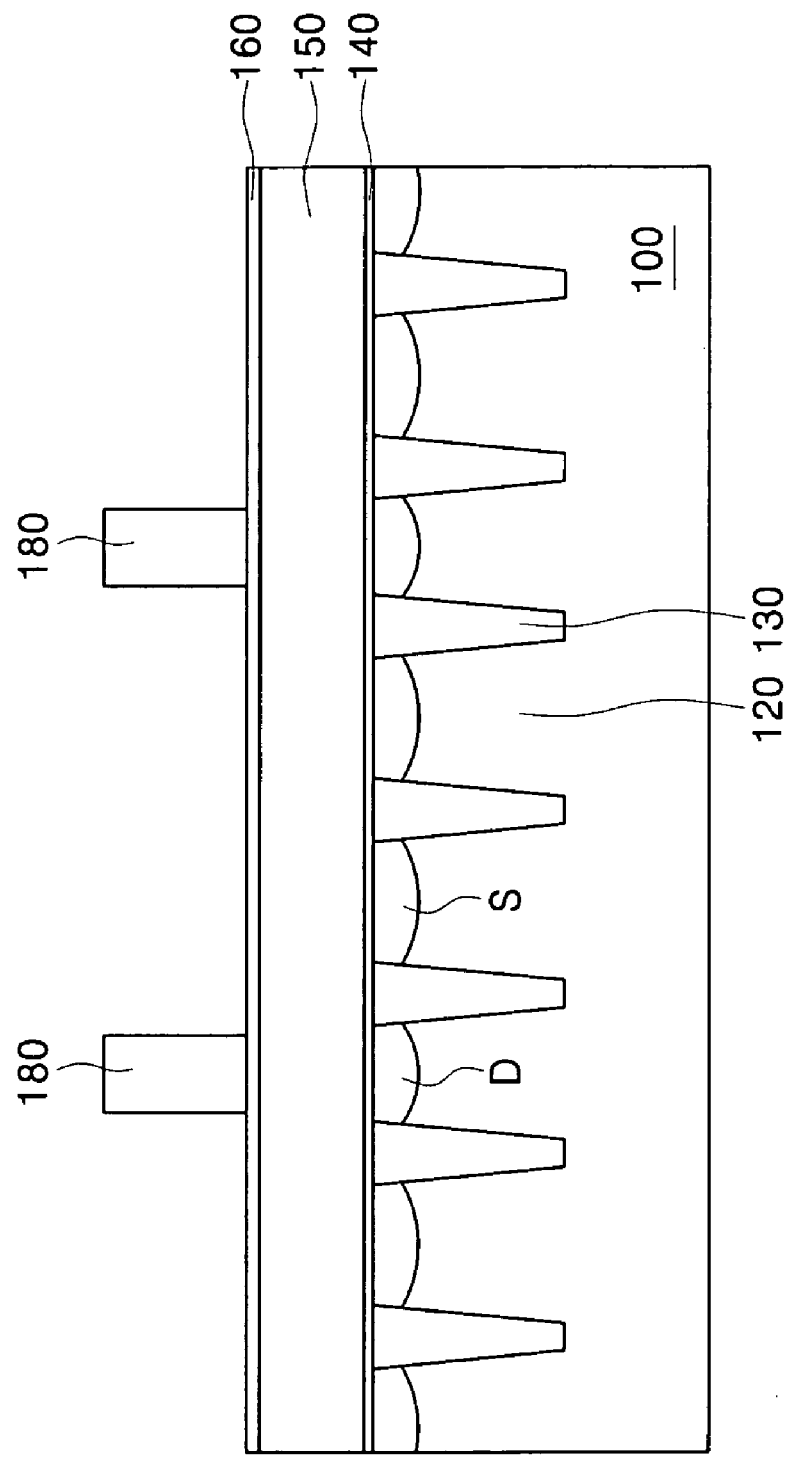

FIG. 10 is a plan view of part of a semiconductor device illustrating methods of manufacturing a semiconductor device according to example embodiments of the inventive concepts. FIG. 11 is a cross-sectional view taken along line XI-XI' of FIG. 10. Referring to FIGS. 10 and 11, a first sacrificial layer, for example an oxide (not shown), may be deposited on the hard mask 170 and planarized until a top surface of the hard mask 170 is exposed. The planarization process may be performed using, for example, an etchback (E/B) and/or chemical mechanical polishing (CMP). The hard mask 170 may be stripped using, for example, an etchback (E/B) and/or an ashing process. Piston-type sacrificial patterns 180 may be formed on the capping oxide layer 160.

Figure 12:
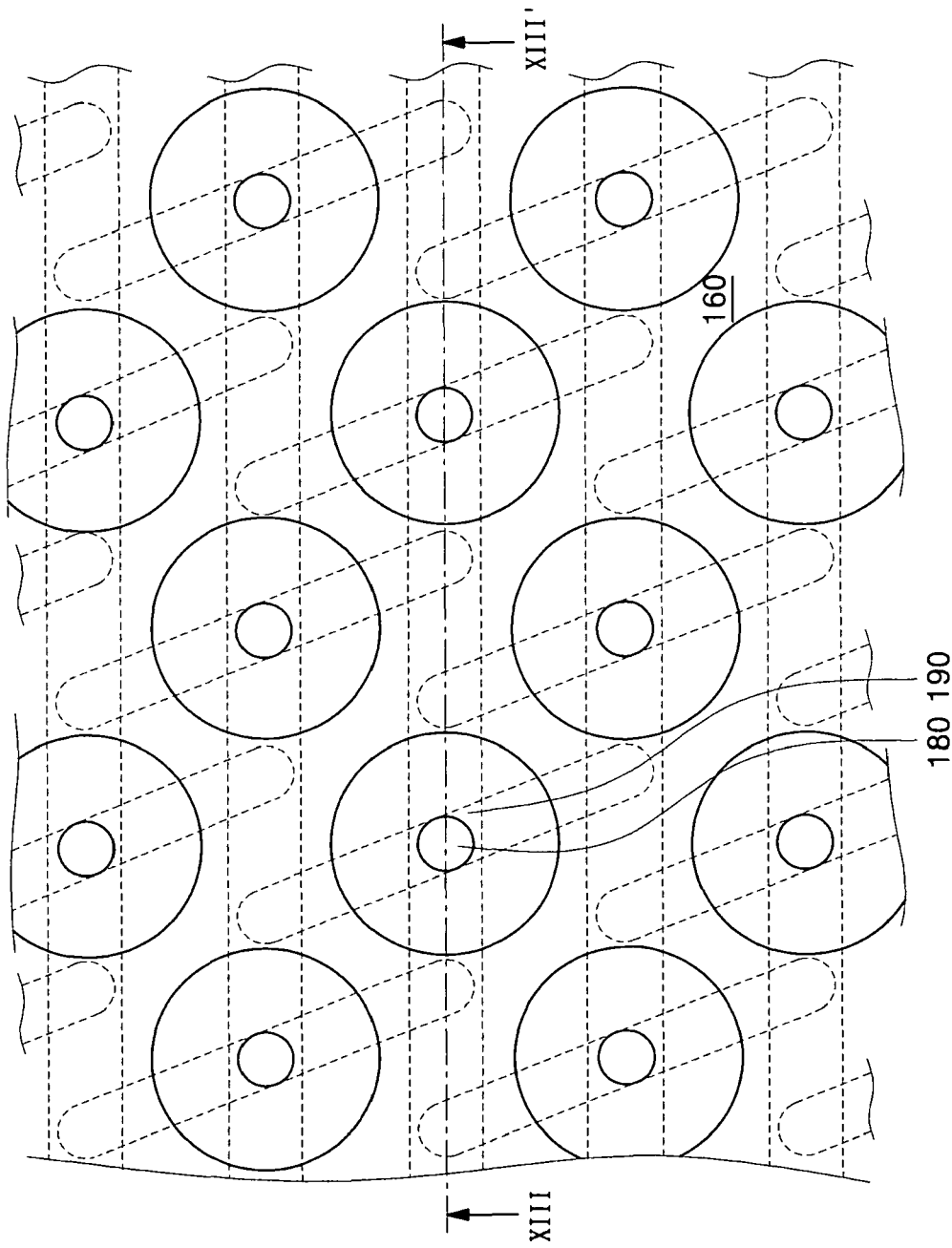
Figure 13:
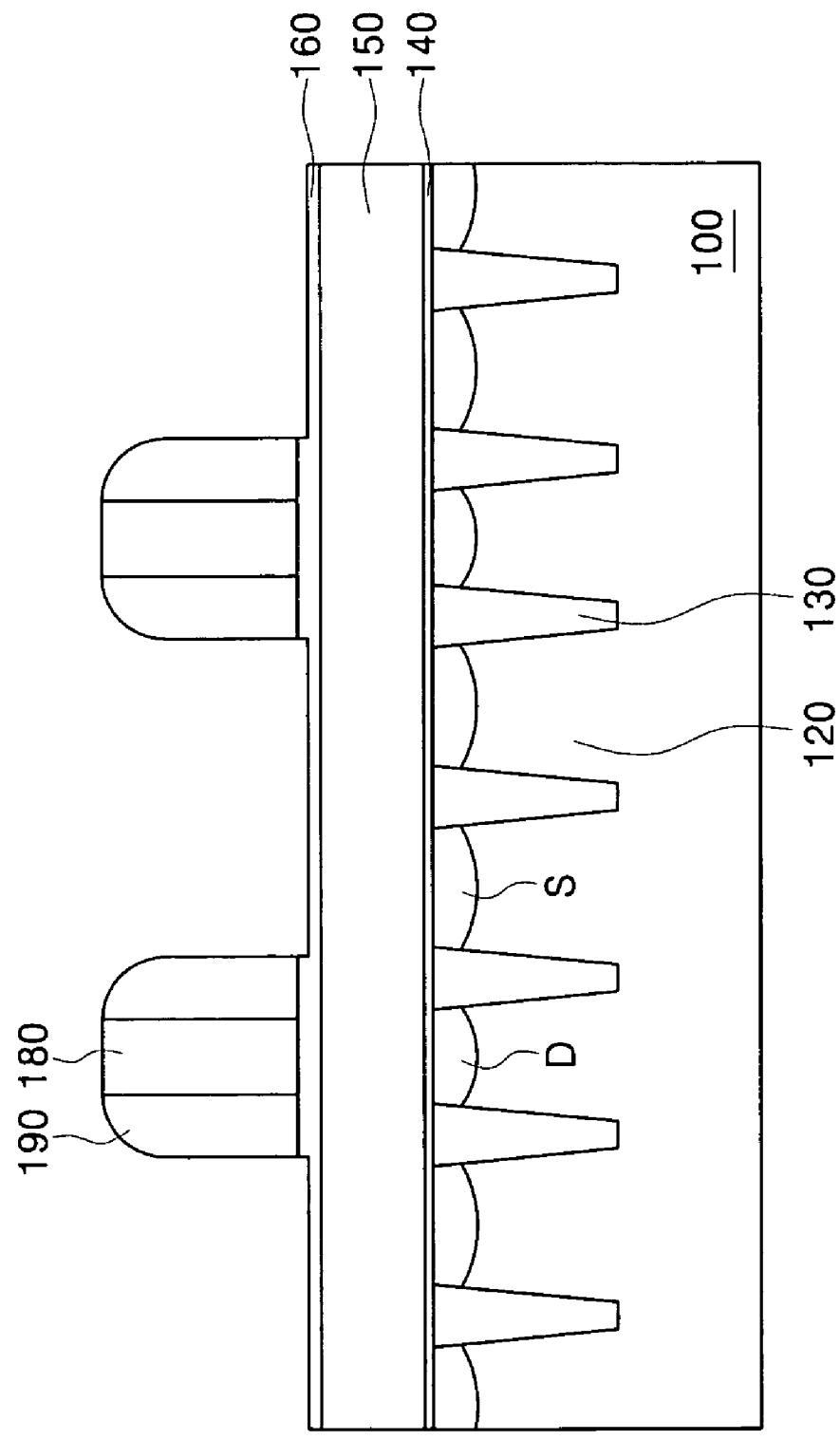

FIG. 12 is a plan view of part of a semiconductor device illustrating methods of manufacturing a semiconductor device according to example embodiments of the inventive concepts. FIG. 13 is a cross-sectional view taken along line XIII-XIII' of FIG. 12. Referring to FIGS. 12 and 13, a second sacrificial layer (e.g., polysilicon (poly-Si)) may be deposited (not shown). For example, a second sacrificial layer may be uniformly deposited. A first sacrificial mask 190 may be formed from the second sacrificial layer. The first sacrificial mask 190 may be formed by, for example, an etch process (e.g., an isotropic etch process).

The first sacrificial mask 190 may be patterned as, for example, a cylindrical or nut type pattern encircling the sacrificial pattern 180. During the patterning of the first sacrificial mask 190, the second sacrificial layer may be isotropically etched and the capping oxide layer 160 may be partially recessed. The first sacrificial mask 190 may be formed of any material having an etch selectivity with respect to the sacrificial patterns 180 (e.g., poly-Si and/or a nitride layer).

Figure 14:
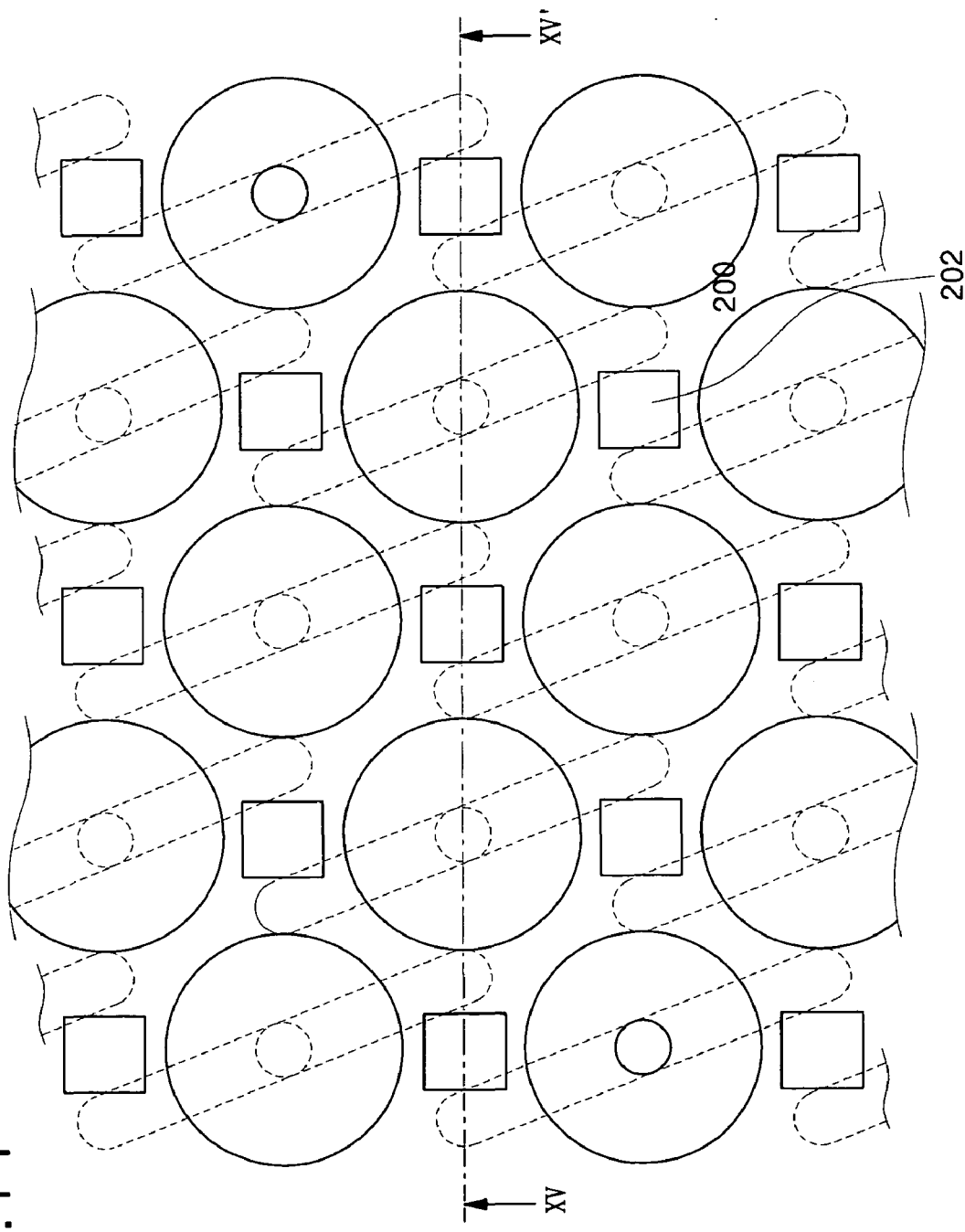
Figure 15:
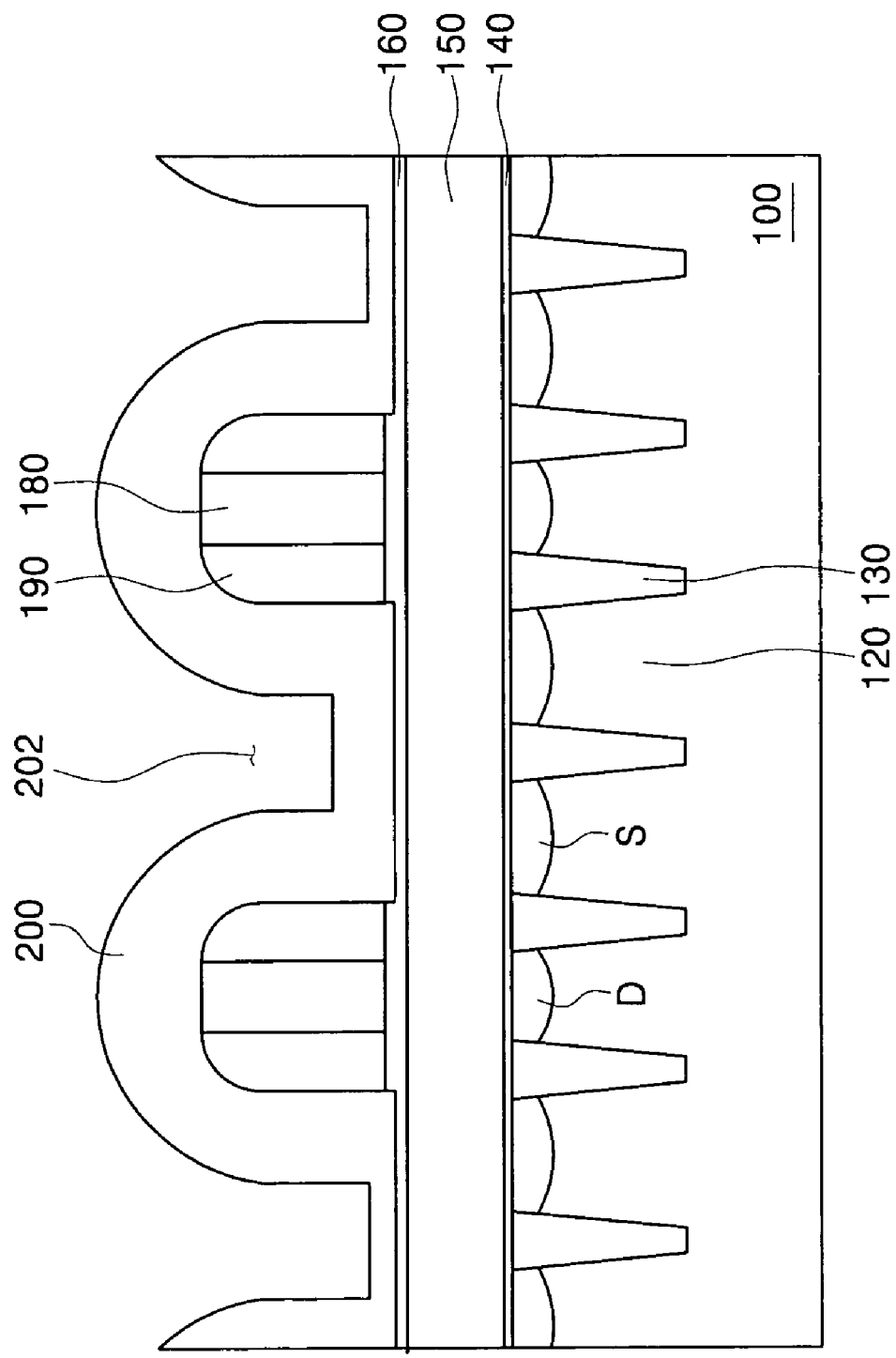

FIG. 14 is a plan view of part of a semiconductor device illustrating methods of manufacturing a semiconductor device according to example embodiments of the inventive concepts. FIG. 15 is a cross-sectional view taken along line XV-XV' of FIG. 14. Referring to FIGS. 14 and 15, a third sacrificial layer 200 (e.g., an oxide layer) may be deposited on the semiconductor substrate 100 including the first sacrificial mask 190. The third sacrificial layer 200 may be deposited on the first sacrificial mask 190 without, for example, using a photolithography process. Voids 202 may naturally (e.g., without a separate process) form between the first sacrificial masks 190. For example, as illustrated in FIG. 14, the voids 202 may be formed at regular intervals between the first sacrificial masks 190 in all directions. As used herein, voids may be holes, spaces between facing portions of a surface the sacrificial layer 200, regions of a surface of a sacrificial layer 200 that are vertically displaced with respect to other regions of a surface of the sacrificial layer 200, and the like. As illustrated in FIG. 15, a void may be a space formed due to, for example, conformal deposition of the sacrificial layer 200 between a plurality of the first sacrificial masks 190.

Figure 16:
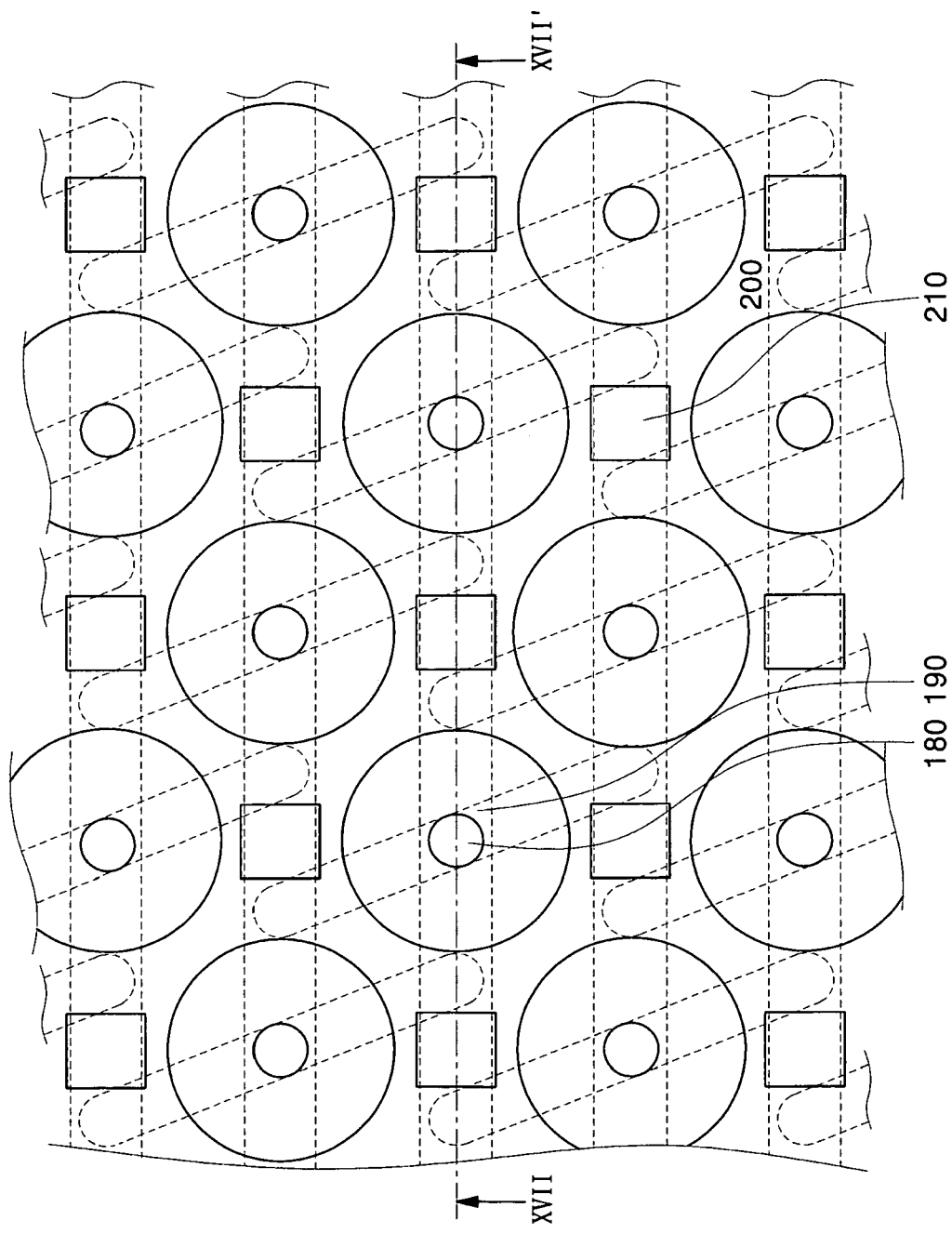
Figure 17:
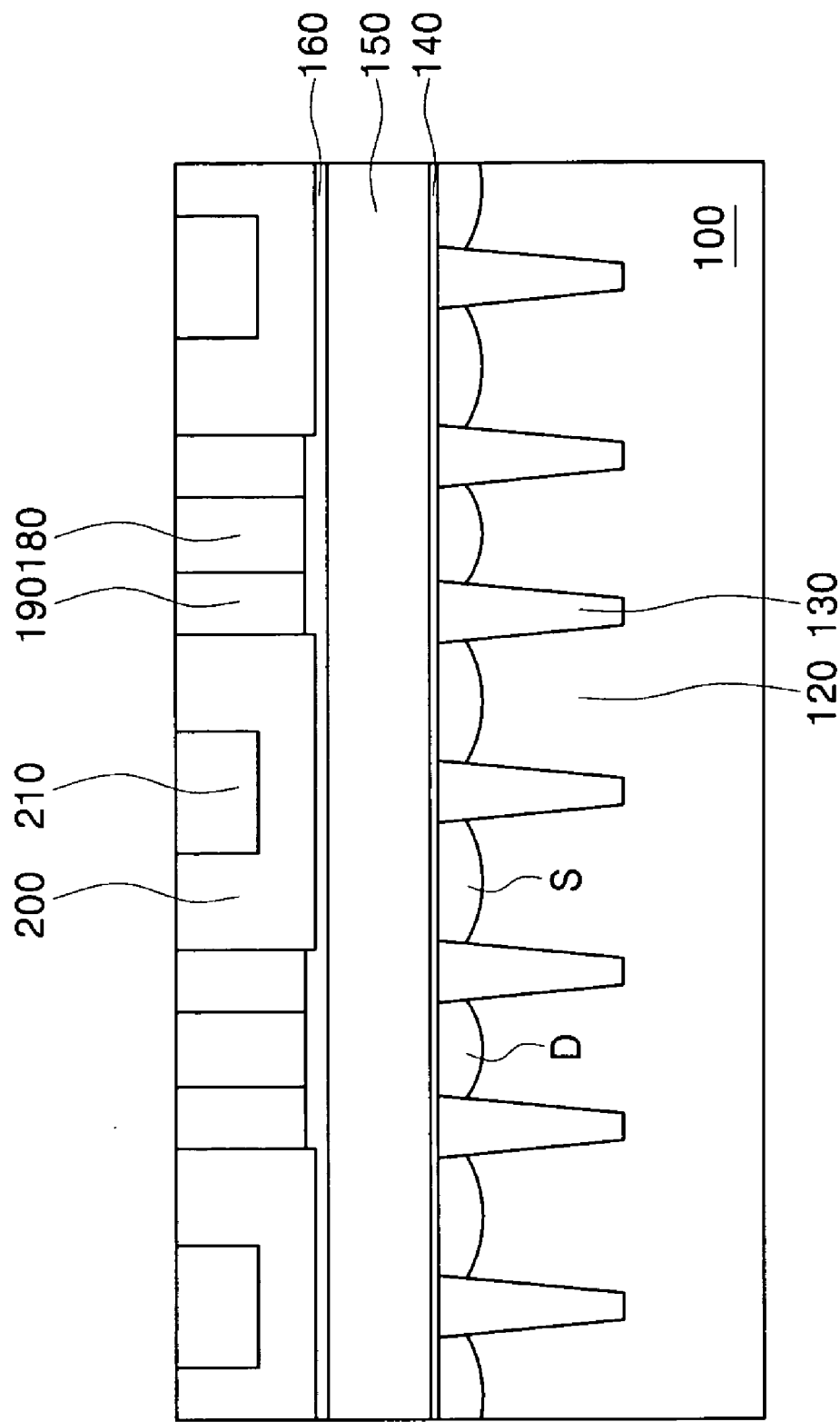

FIG. 16 is a plan view of part of a semiconductor device illustrating methods of manufacturing a semiconductor device according to example embodiments of the inventive concepts. FIG. 17 is a cross-sectional view taken along line XVII-XVII' of FIG. 16. Referring to FIGS. 16 and 17, a fourth sacrificial layer (not shown), for example a poly-Si layer, may be deposited in the voids 202. A second sacrificial mask 210 may be formed by removing a top surface of the fourth sacrificial layer. The second sacrificial mask 210 may be formed using, for example, an etchback or CMP. Because the voids 202 may be formed at regular intervals between the first sacrificial masks 190 adjacent to one another, the voids 202 may easily have a rectangular cross-sectional shape. The second sacrificial mask 210 may be formed, for example, as a square pillar type.

Figure 18:
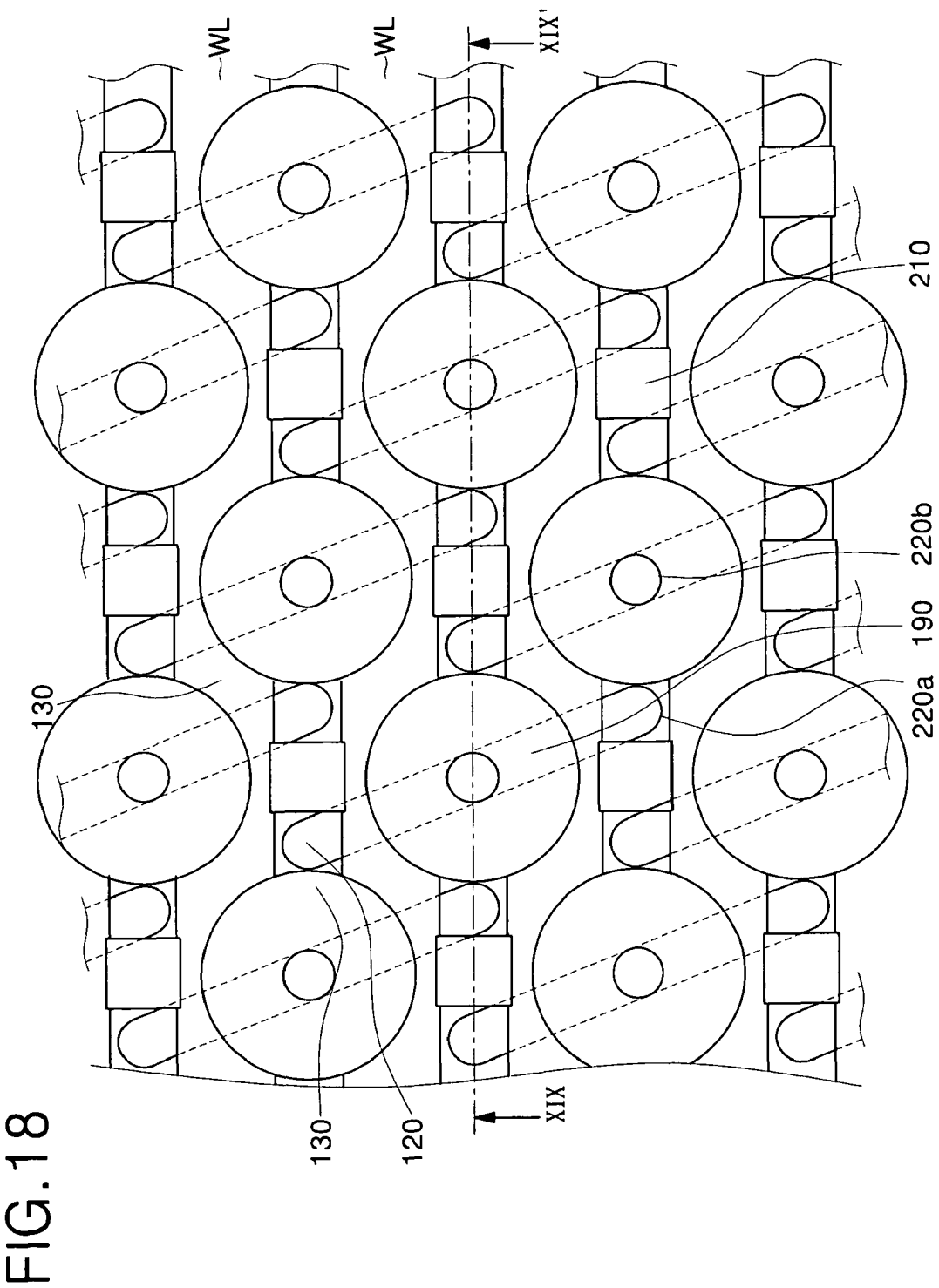
Figure 19:
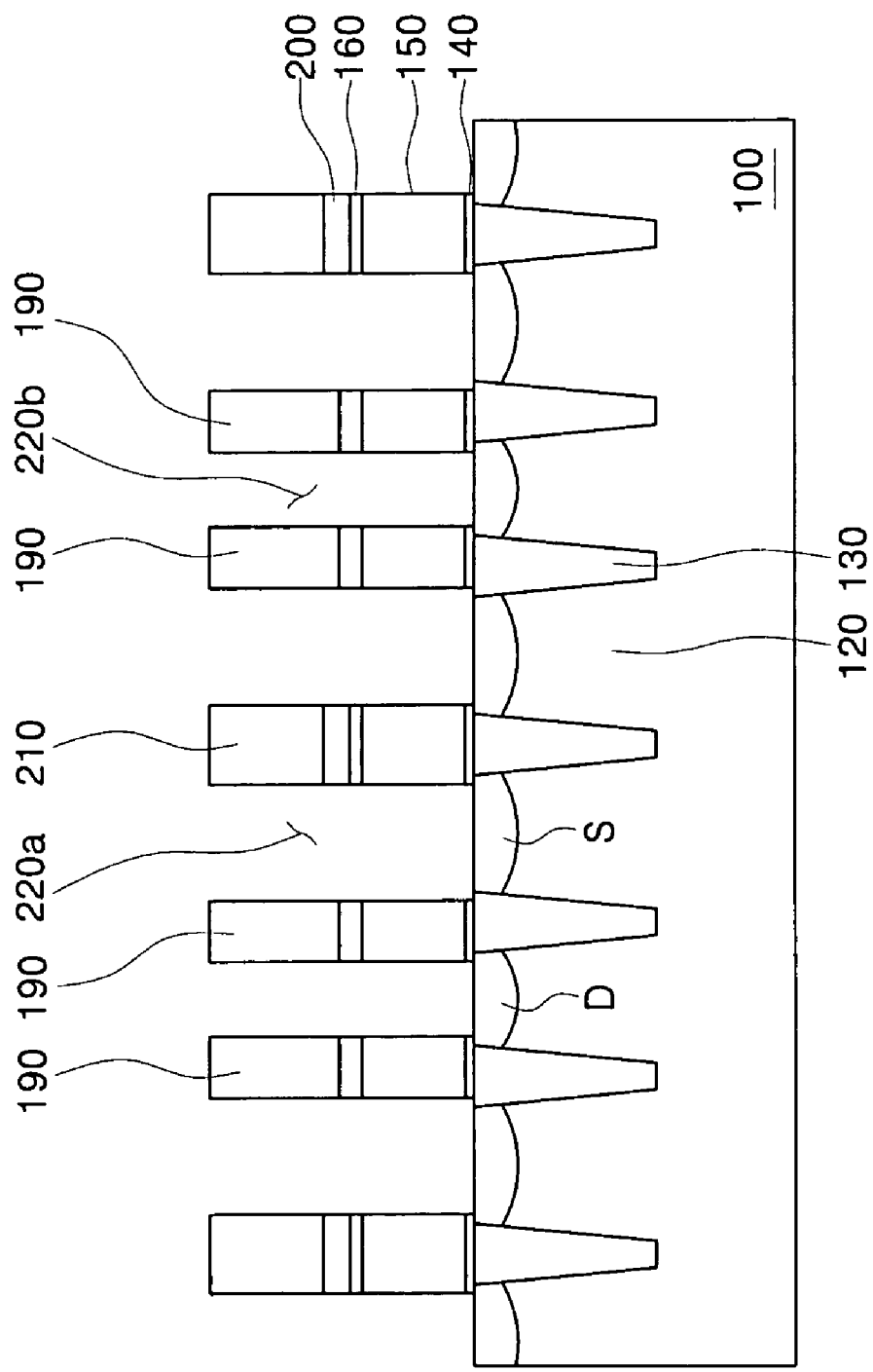

FIG. 18 is a plan view of part of a semiconductor device illustrating methods of manufacturing a semiconductor device according to example embodiments of the inventive concepts. FIG. 19 is a cross-sectional view taken along line XIX-XIX' of FIG. 18. Referring to FIGS. 18 and 19, the third sacrificial layer 200 may be removed in areas not including a sacrificial mask 190 or 210 by, for example, using an etch process. During the removal of the third sacrificial layer 200, the first interlayer insulating layer 150 and the stopper layer 140 may be removed in areas not including a sacrificial mask 190 or 210. By selectively removing the third sacrificial layer 200 and the stopper layer 140, a BC contact hole 220a and a DC contact hole 220b may be formed at the same time to expose the active region 120. The BC contact hole and the DC contact hole may be sized based on the size of the sacrificial masks 190 and 210.

Figure 20:
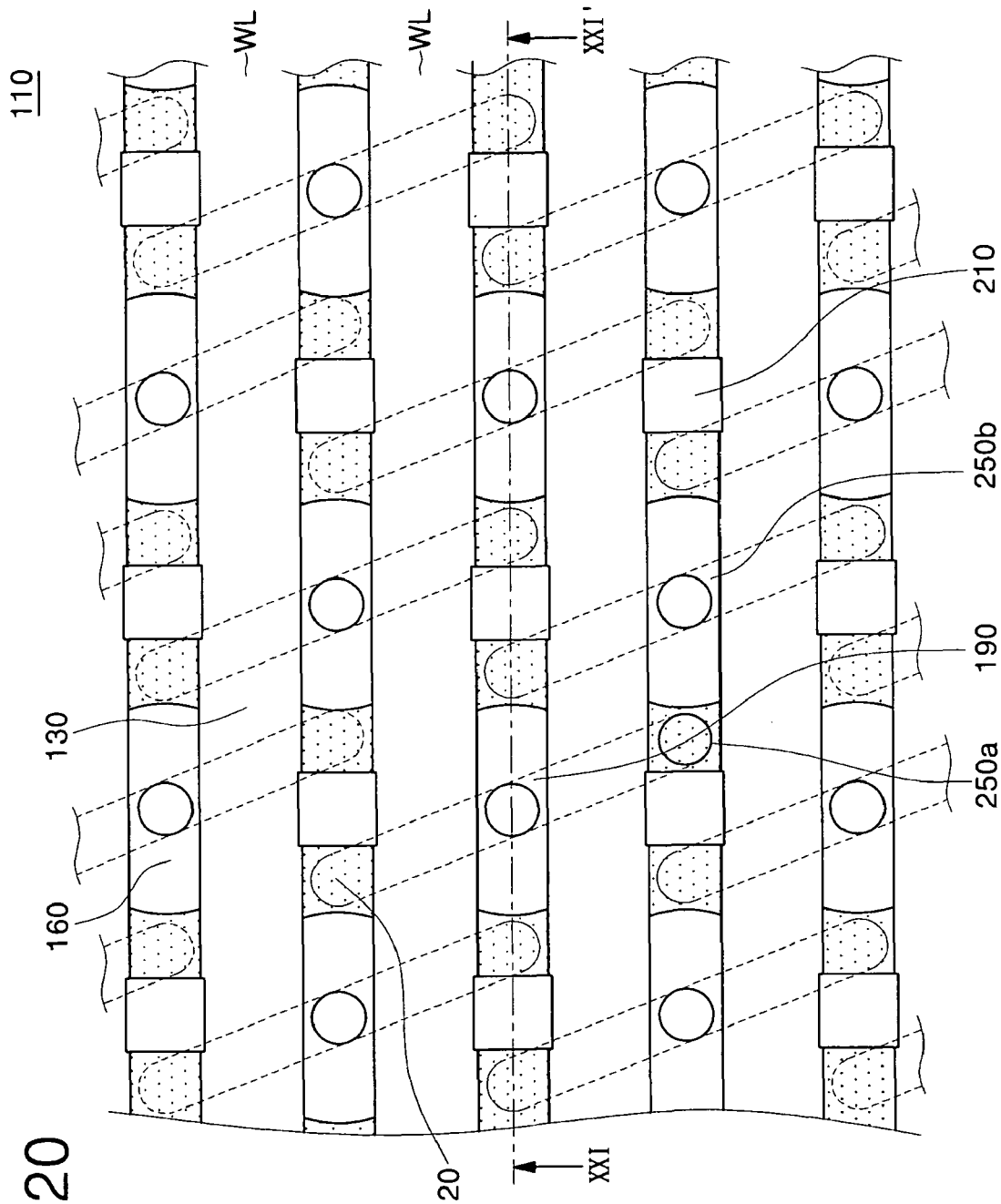
Figure 21:
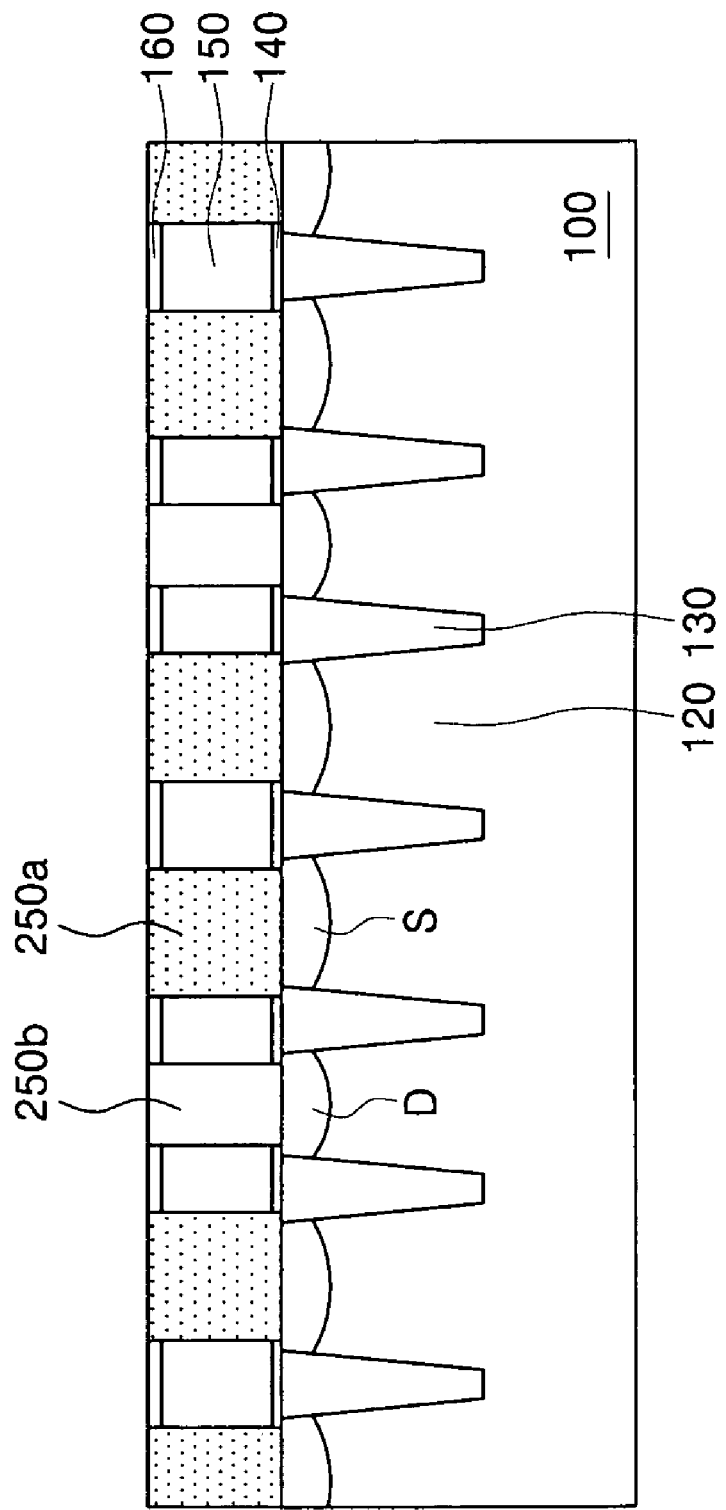

FIG. 20 is a plan view of part of a semiconductor device illustrating methods of manufacturing a semiconductor device according to example embodiments of the inventive concepts. FIG. 21 is a cross-sectional view taken along line XXI-XXI' of FIG. 20. Referring to FIGS. 20 and 21, a plurality of contact pads 250a and 250b may be formed (e.g., using a SAC process). A conductive material may be deposited to fill the BC contact hole 220a and the DC contact hole 220b, and contact pads 250a and 250b may be formed within the BC contact hole 220a and the DC contact hole 220b, respectively. The contact pads 250a and 250b may be formed of the same conductive material, for example, poly-Si. The conductive material may be removed from the word lines WL using, for example, an etchback and/or CMP so that a plurality of contact pads 250a and 250b may be separated from one another.

Figure 22:
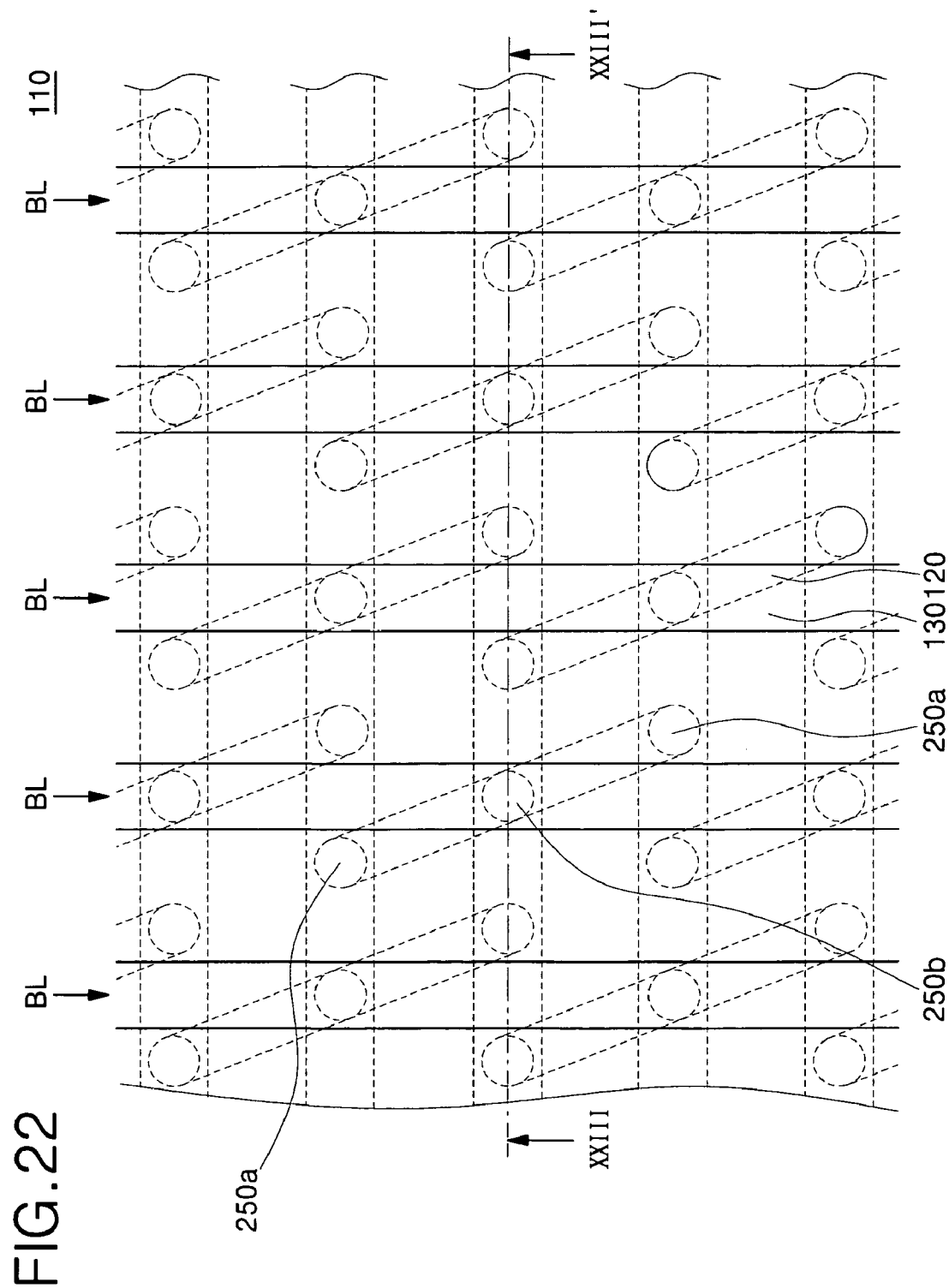
Figure 23:
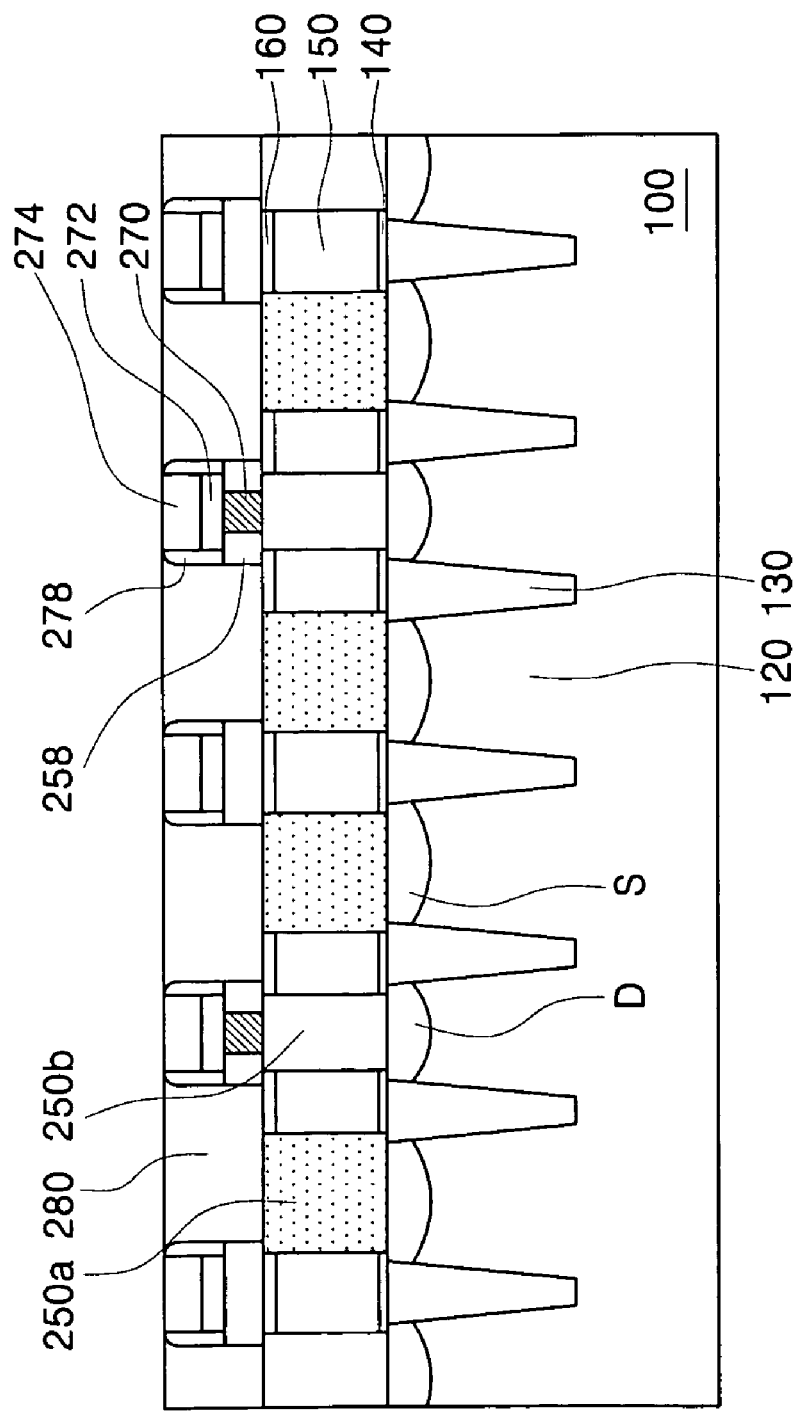
Figure 24:
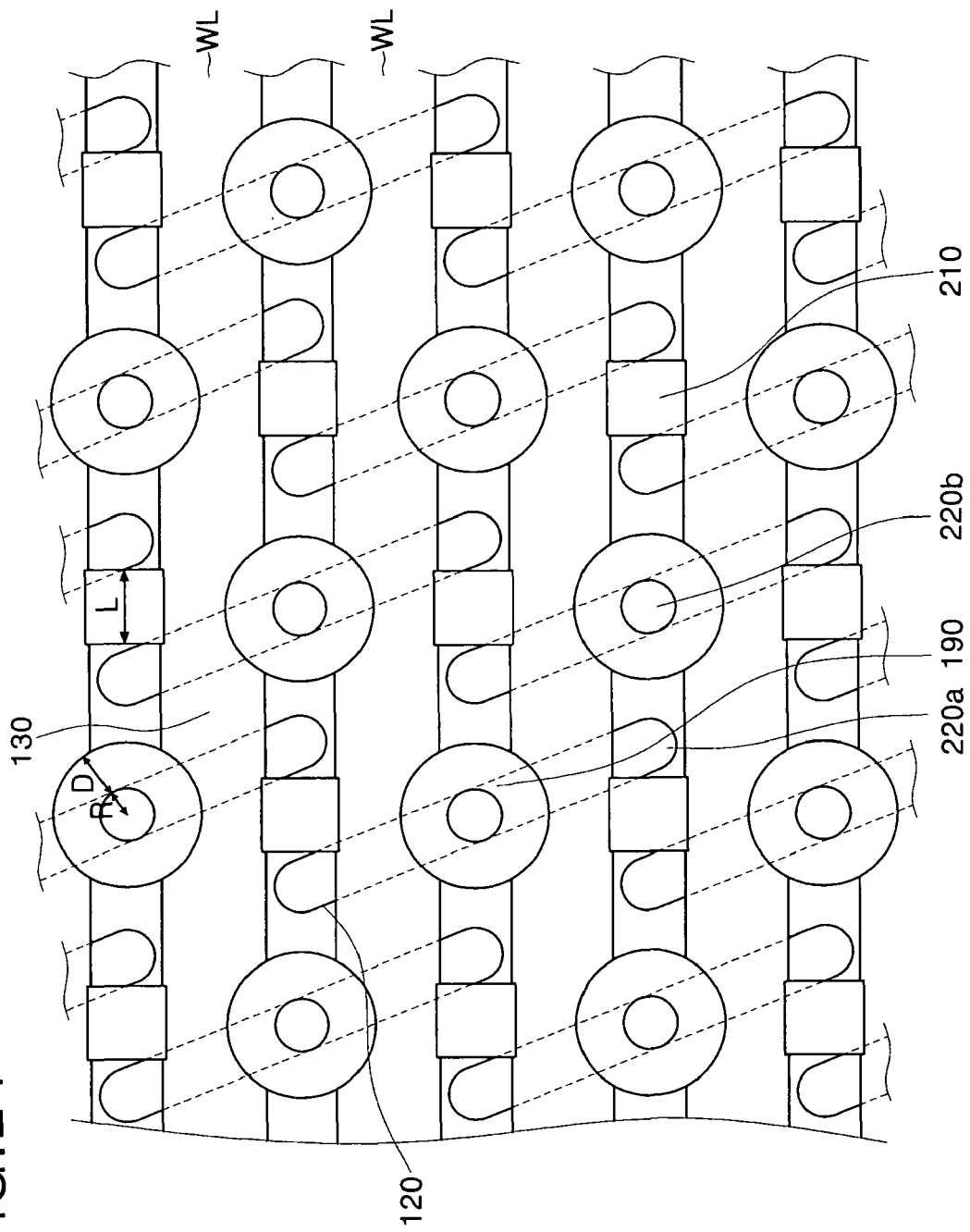

FIG. 22 is a plan view of part of a semiconductor device illustrating methods of manufacturing a semiconductor device according to example embodiments of the inventive concepts. FIG. 23 is a cross-sectional view taken along line XXIII-XIII' of FIG. 22. Referring to FIGS. 22 and 23, a second interlayer insulating layer 258 may be deposited on the contact pads 250a and 250b. DC exposure holes (not shown) may be formed in the second interlayer insulating layer 258 to expose the DC bit line contact pad 250b. The DC exposure holes may be filled with a conductive material. The conductive material may form a DC contact 270 to connect the DC bit line contact pad 250b with a bit line interconnection 272. A bit line interconnection 272 and a capping insulating layer 274 may be formed on the DC contact 270 using, for example, a bit line process.

A third interlayer insulating layer (not shown) may be formed to cover the capping insulating layer 274 and partially recessed to form spacers 278 on both sides of the bit line interconnection 272, and overetched to anisotropically etch the second interlayer insulating layer 258. In order to maximize and/or increase a width of the spacers 278, the spacers 278 may be formed on both sides of the bit line interconnection 272 and the capping insulating layer 274. A BC exposure hole (not shown) exposing the BC storage contact pad 250a may be formed using the spacers 278 as an etch mask and filled with a conductive material, thereby forming a BC contact 280. As shown in FIG. 3, a cylindrical storage electrode 290 may be formed on the BC contact 280.

Even if the spacers 278 are formed to a great and/or increased width, and the BC exposure hole is formed using the spacers 278 as an etch mask, the sum of sectional areas of the bit line interconnection 272 and the spacer 278 may be larger than the sectional area of the DC bit line contact pad 250b. If contacts are not properly self-aligned the BC contact 280 may shift towards an adjacent DC bit line contact pad 250b. In order to provide provisions against a case where it is difficult to maintain a safe distance and prevent a short only by the width of the spacers 278, it may be necessary to minimize and/or reduce the width of the DC bit line contact pad 250b and maximize and/or increase the width of the BC storage contact pad 250a.

Figure 25:
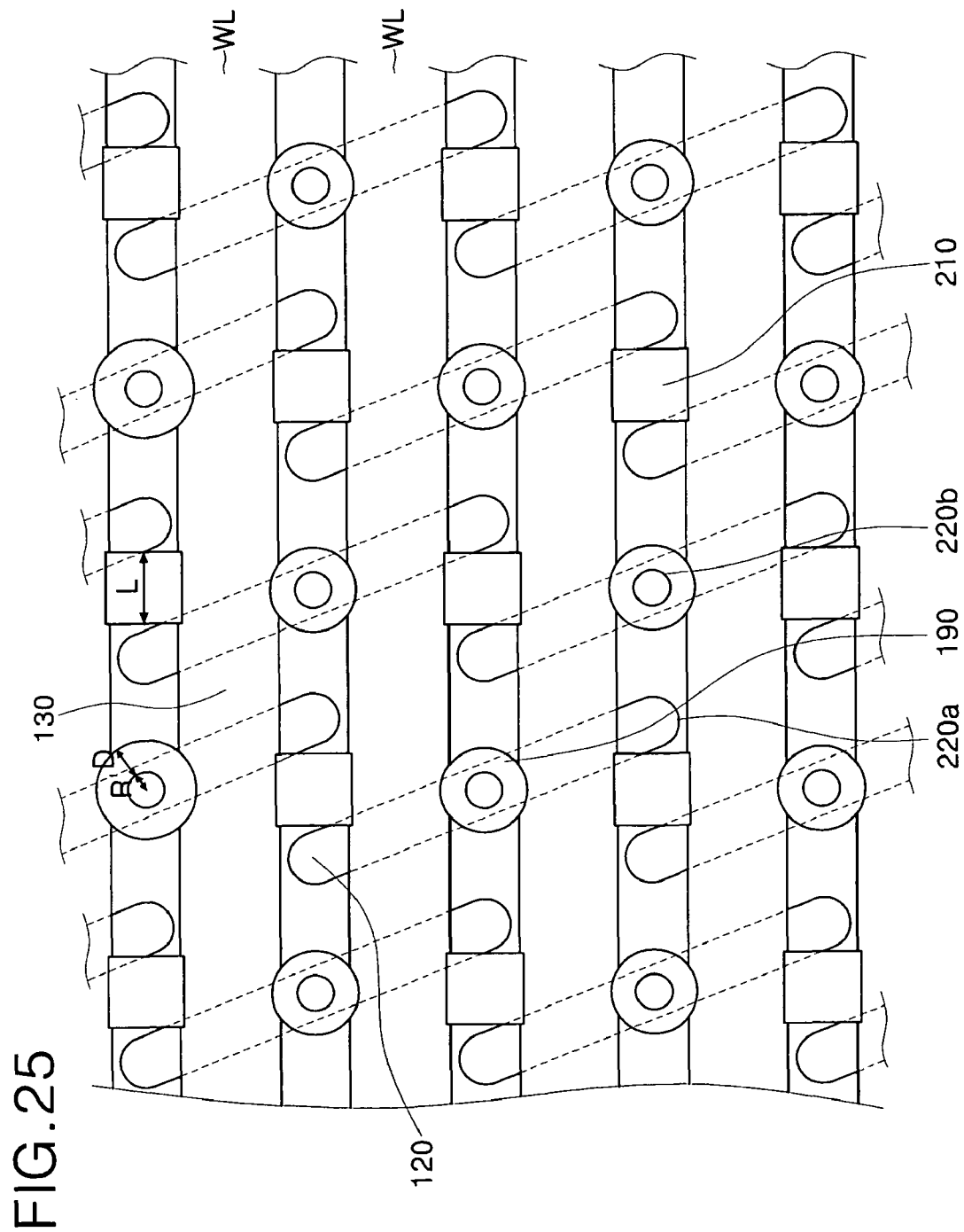

FIGS. 24-27 are plan views illustrating sacrificial masks of various sizes. Referring to FIGS. 24-27, a cylindrical first sacrificial mask 190 of FIG. 24 may exploit the fact that the sectional areas of the BC storage contact pad 250a and the DC bit line contact pad 250b may be varied, for example, according to a ring radius R, a ring thickness D, and a width L of the second sacrificial mask 210. For example, as shown in FIG. 25, the ring radius R may be reduced to a ring radius R', and the ring DC contact hole 220b may be maximally reduced and/or reduced as compared to FIG. 24. The sectional area of the DC bit line contact pad 250b may be varied according to the sectional area of the sacrificial pattern 180. Because the thickness D may be maintained constant, the sectional area of the BC storage contact pad 250a may be relatively increased. As illustrated in FIGS. 10 and 11, the ring radius R may be determined during the formation of the cylindrical sacrificial pattern 180.

Figure 26:
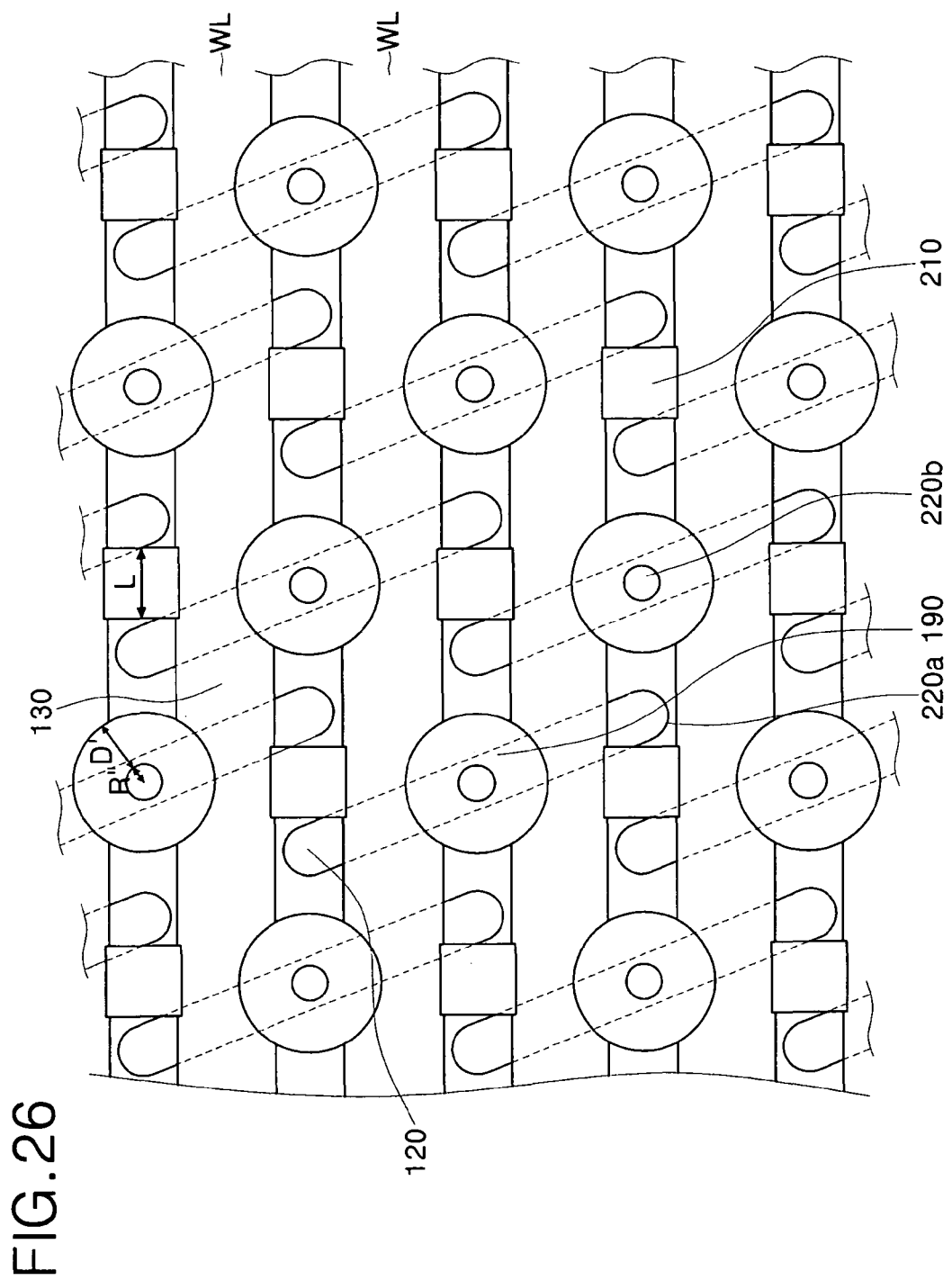

As shown in FIG. 26, when the ring radius R is reduced to a ring radius R" and the ring thickness D is increased to a thickness D', only the sectional area of the DC contact hole 220b may be reduced. The sectional area of the BC storage contact pad 250a may be maintained constant, while the sectional area of the DC bit line contact pad 250b may be reduced. In this case, as illustrated in FIGS. 12 and 13, the ring thickness D may be determined during the formation of the first sacrificial mask 190.

Figure 27:
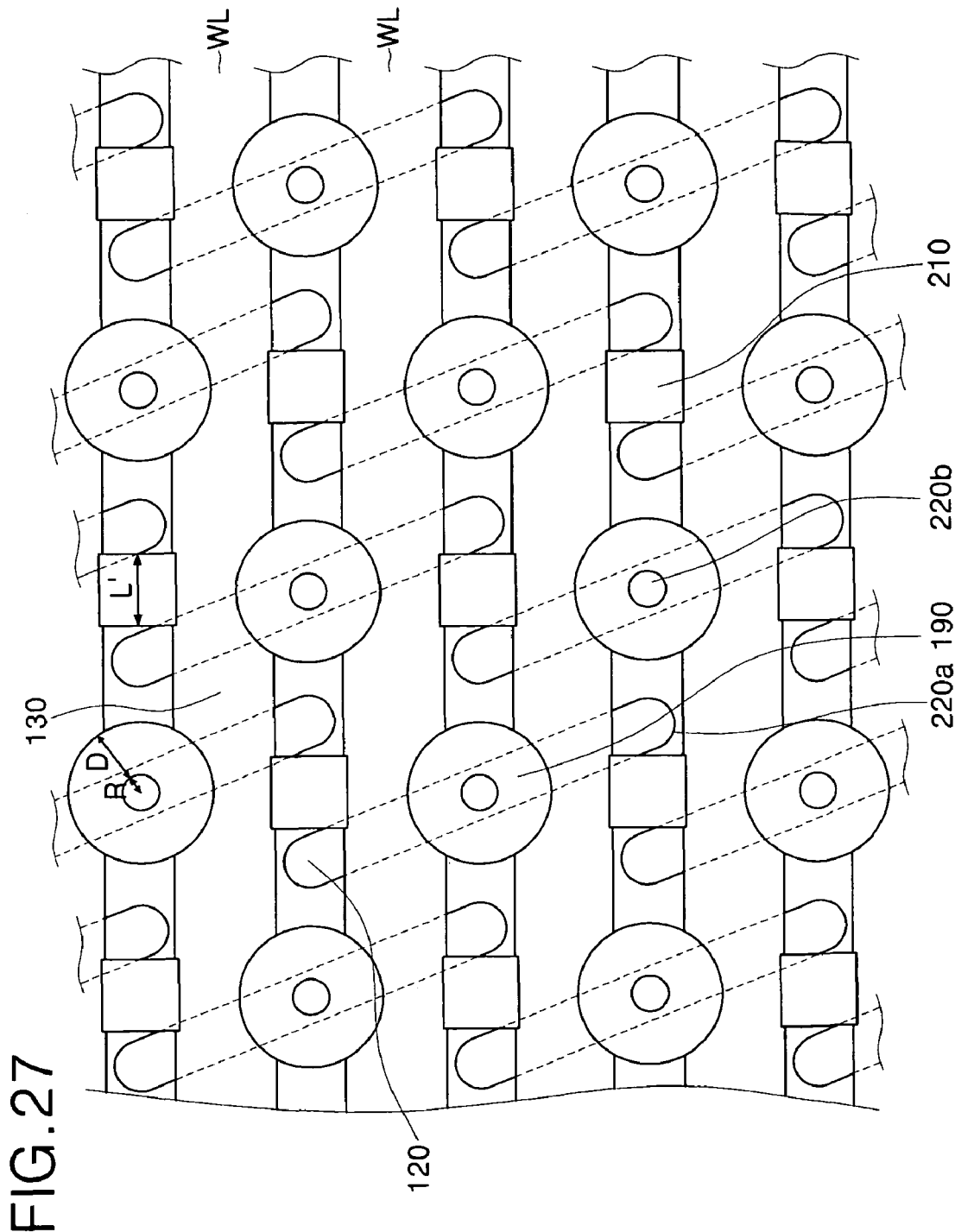

The second sacrificial mask 210, which may be formed as a square type, may exploit the fact that the sectional area of the BC storage contact pad 250a may be varied according to the width L of the second sacrificial mask 210. For example, as shown in FIG. 27, when the length L of the second sacrificial mask 210 is increased to a length L', the sectional area of the BC storage contact pad 250a may be maximally increased and/or increased. Although not shown, when the length L of the second sacrificial mask 210 is increased, the sectional area of the BC storage contact pad 250a may be reduced. In this case, as shown in FIGS. 14 and 15, the length L of the square-type second sacrificial mask 210 may be determined during the formation of the second sacrificial mask 210.

When two different kinds of contact holes with different sizes are formed by performing two processes, each including a photolithography and etch process, fabrication costs may be increased. According to example embodiments of the inventive concepts, a hard mask may be formed using one process including a photolithography and etch process, and first and second sacrificial masks may be formed by, for example, depositing and etching a poly-Si layer.

In the case of a semiconductor memory device having a 6F2 DRAM cell, a distance between active regions is only 1F. According to example embodiments of the inventive concepts, by selectively increasing the sectional area of a contact pad of a storage electrode, a contact area may be increased, while a contact resistance may be reduced. By distinguishing a BC storage contact pad contacting a BC from a DC bit line contact pad contacting a DC, the sectional areas of the BC storage contact pad and the DC bit line contact pad may be selectively increased or reduced. By reducing the sectional area of the DC bit line contact pad, the likelihood of a short between the DC bit line contact pad and its BC contact may be reduced. By increasing the sectional area of the BC storage contact pad, an overlap contact area between the BC storage contact pad and the BC contact may be increased. Contact holes having different diameters may be formed using one photolithography process and fabrication costs may be reduced compared to a case where a photolithography process is performed twice.

While example embodiments have been particularly shown and described, it will be understood by one of ordinary skill in the art that variations in form and detail may be made therein without departing from the spirit and scope of the claims.

What is claimed is:

1. A method of manufacturing a semiconductor device, comprising:
    forming a first material layer;
    forming a hard mask including a plurality of mask holes on the first material layer;
    forming a first sacrificial layer in the mask holes;
    removing the hard mask to form a plurality of sacrificial patterns including the first sacrificial layer;
    forming a second material layer on the sacrificial patterns;
    removing part of the second material layer to form a plurality of first sacrificial masks, each of the sacrificial patterns at least partially surrounded by a corresponding one of the first sacrificial masks;
    forming a second sacrificial layer on the first sacrificial masks, the second sacrificial layer formed to include voids;
    forming a third material layer in the voids;
    removing part of the third material layer to form a plurality of second sacrificial masks; and
    removing at least part of the sacrificial patterns, the second sacrificial layer, and the first material layer such that a plurality of first contact holes are formed between the first sacrificial masks and the second sacrificial masks, and a plurality of second contact holes are formed within the first sacrificial masks.

2. The method of claim 1, wherein the first material layer is on a substrate including an active region defined by an isolation region, the active region intersected by a plurality of word lines and a bit line,
    the first and second contact holes expose regions of the active region, and
    the semiconductor device has a 6F2 layout in which the active region is tilted in a diagonal direction to the word lines and the bit line.

3. The method of claim 1, wherein the first material layer is on a substrate including an active region defined by an isolation region, the active region intersected by a plurality of word lines and a bit line, and
    the mask holes are arranged at regular intervals between the word lines, the mask holes overlapping the active region, the mask holes formed in a circular shape with a diameter smaller than a distance between word lines.

4. The method of claim 1, wherein there is etch selectivity between a material of the second material layer and a material of the first sacrificial layer,
    there is etch selectivity between a material of the third material layer and a material of the second sacrificial layer,
    the first and second sacrificial layers include at least one oxide, and
    the second and third material layers are at least one of a polysilicon (poly-Si) layer and a nitride layer.

5. The method of claim 1, wherein the voids are formed at regular intervals between adjacent first sacrificial masks.

6. The method of claim 1, further comprising:
    filling the first contact holes with a first conductive material to form a plurality of buried contact (BC) storage contact pads; and
    filling the second contact holes with a second conductive material to form a plurality of direct contact (DC) bit line contact pads,
    wherein the sectional areas of the BC storage contact pads and the DC bit line contact pads are based on the sectional areas of the sacrificial pattern, the first sacrificial mask, and the second sacrificial mask.

7. The method of claim 6, wherein the first material layer is a first interlayer insulating layer.

8. The method of claim 7, further comprising:
    depositing a second interlayer insulating layer on the BC storage contact pads and the DC bit line contact pads;
    forming a plurality of DC exposure holes to expose the DC bit line contact pads in the second interlayer insulating layer;
    filling the DC exposure holes with a conductive material to form a plurality of DC contacts;
    forming a bit line interconnection and a capping insulating layer on the DC contacts;

depositing a third interlayer insulating layer on the capping insulating layer;
recessing a part of the third interlayer insulating layer;
forming spacers on both sides of at least one of the capping insulating layer and the bit line interconnection;
forming a plurality of BC exposure holes to expose the BC storage contact pads using the spacers as an etch mask;
filling the BC exposure holes with a conductive material to form a plurality of BC contacts; and
forming a plurality of storage electrodes on the BC contacts.

9. The method of claim 1, wherein the first contact holes have a greater sectional area than the second contact holes.

10. The method of claim 1, wherein the forming of the sacrificial patterns includes forming the sacrificial patterns to be piston shaped, and
a radius of the second contact holes is proportional to a radius of the piston-shaped sacrificial patterns.

11. The method of claim 1, wherein the forming of the first sacrificial masks includes forming the first sacrificial masks to be cylindrical,
the forming of the second sacrificial masks includes forming the second sacrificial masks to be pillar-shaped, and
at least one of a cross-sectional width of the cylindrical first sacrificial masks and a cross-sectional width of the pillar-shaped second sacrificial masks bears a relationship of inverse proportionality to a sectional area of the first contact holes.

12. A method of manufacturing a semiconductor device including a plurality of first contact holes and a plurality of second contact holes, the first contact holes having a different size than the second contact holes, comprising:
forming a piston-shaped sacrificial pattern on a substrate, the piston-shaped sacrificial pattern formed to a radius corresponding to one of the first contact holes;
forming a cylindrical first sacrificial mask around the piston-shaped sacrificial pattern, a width of the cylindrical first sacrificial mask corresponding to a distance between the first and second contact holes; and
forming a pillar-shaped second sacrificial mask on the substrate, a width of the pillar-shaped second sacrificial mask corresponding to a distance between adjacent second contact holes.

13. The method of claim 12, wherein the forming of the piston-shaped pattern includes performing only one photolithography process and one etch process, the forming of the piston-shaped pattern including
stacking a hard mask material layer on the semiconductor substrate,
coating photoresist on the hard mask material layer,
exposing the photoresist,
developing the photoresist,
etching the hard mask layer to form a hard mask including a mask hole corresponding to the first contact hole,
depositing an oxide layer in the mask hole, and
removing the hard mask.

14. The method of claim 12, wherein forming the cylindrical first sacrificial mask includes depositing a poly-Si layer on the piston-shaped sacrificial pattern and etching the poly-Si layer into a cylindrical shape.

15. The method of claim 12, wherein the forming of the pillar-shaped second sacrificial mask includes
depositing an oxide layer on the first cylindrical sacrificial mask such that a void is formed in the oxide layer,
depositing a poly-Si layer in the void, and
etching the poly-Si layer into a pillar shape.

16. A method of manufacturing a semiconductor device, comprising:
forming an active region in a semiconductor substrate;
forming a plurality of gate electrodes on the substrate, the gate electrodes formed diagonally to the active region;
forming an interlayer insulating layer between the gate electrodes;
forming a hard mask including a plurality of mask holes on the interlayer insulating layer, the mask holes exposing the interlayer insulating layer;
forming a first oxide layer in the mask holes;
removing the hard mask to form a plurality of piston-shaped sacrificial patterns corresponding to the first oxide layer in the mask holes;
depositing a first poly-Si layer on the piston-shaped sacrificial patterns;
etching the first poly-Si layer to form a plurality of cylindrical first sacrificial masks, each of the cylindrical first sacrificial masks surrounding one of the piston-shaped sacrificial patterns;
forming a second oxide layer on the cylindrical first sacrificial masks such that voids are formed between the cylindrical first sacrificial masks;
depositing a second poly-Si layer in the voids;
etching back the second poly-Si layer to form a plurality of pillar-shaped second sacrificial masks corresponding to the voids; and
removing the second oxide layer and the piston-shaped sacrificial patterns to expose the active region such that two different types of contact holes of different sizes are formed.

17. The method of claim 16, wherein the mask holes are on the active region, and
the voids are not on the active region.

18. A method of manufacturing a semiconductor device, comprising:
forming a plurality of bar-shaped active regions in a semiconductor substrate using an isolation process;
forming a plurality of straight word lines using a gate process;
forming an interlayer insulating layer between the word lines using a gap fill process;
forming a silicon hard mask material layer on the entire surface of the semiconductor substrate;
forming a hard mask having a plurality of mask holes, the hard mask formed by using photolithography and etching processes on the hard mask material layer;
forming a first oxide layer in the mask holes;
removing the hard mask to form a plurality of piston-shaped sacrificial patterns;
forming one of a first poly-Si layer and a first nitride layer on the sacrificial patterns;
patterning the one of the first poly-Si layer and the first nitride layer to form a plurality of cylindrical first sacrificial masks surrounding the piston-shaped sacrificial patterns;
conformally forming a second oxide layer on the cylindrical first sacrificial masks, the second oxide layer formed to include voids;
forming one of a second poly-Si layer and a second nitride layer in the voids;
etching back the one of the second poly-Si layer and the second nitride layer to form a plurality of pillar-shaped second sacrificial masks between the cylindrical first sacrificial masks;
removing the piston-shaped sacrificial patterns and second oxide layer to expose the active region such that a first contact hole is formed between each of the cylindrical first sacrificial masks and the pillar-shaped second sacrificial masks, and a second contact hole is formed within each of the cylindrical first sacrificial masks;

forming BC storage contact pads in the first contact holes; and forming DC bit line contact pads in the second contact holes.

19. The method of claim 18, wherein the BC storage contact pads have a same sectional area as the DC bit line contact pads.

20. The method of claim 19, wherein the BC storage contact pads have a greater sectional area than the DC bit line contact pads.

* * * * *